(12) United States Patent
Park et al.

(10) Patent No.: US 9,311,856 B2
(45) Date of Patent: Apr. 12, 2016

(54) DRIVER WITH SEPARATE POWER SOURCES AND DISPLAY DEVICE USING THE SAME

(75) Inventors: Dong-Wook Park, Yongin (KR); Ki-Nyeng Kang, Yongin (KR); Keum-Nam Kim, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 499 days.

(21) Appl. No.: 13/315,548

(22) Filed: Dec. 9, 2011

(65) Prior Publication Data
US 2012/0188290 A1 Jul. 26, 2012

(30) Foreign Application Priority Data
Jan. 21, 2011 (KR) .................. 10-2011-0006319

(51) Int. Cl.
*G09G 3/30* (2006.01)
*G09G 3/32* (2006.01)
*G11C 19/18* (2006.01)

(52) U.S. Cl.
CPC ............ *G09G 3/3266* (2013.01); *G11C 19/184* (2013.01); *G09G 2300/0861* (2013.01); *G09G 2320/064* (2013.01); *G09G 2320/0626* (2013.01)

(58) Field of Classification Search
CPC ...................................... G09G 3/3208–3/3291
USPC .................. 345/36, 39, 45, 55, 56, 76–83
See application file for complete search history.

(56) References Cited

U.S. PATENT DOCUMENTS

| | | | |
|---|---|---|---|
| 2005/0285824 A1* | 12/2005 | Shin | 345/76 |
| 2006/0087478 A1* | 4/2006 | Eom | 345/45 |
| 2006/0156121 A1* | 7/2006 | Chung | 714/726 |
| 2007/0080907 A1* | 4/2007 | Park et al. | 345/76 |
| 2007/0240024 A1* | 10/2007 | Shin | 714/726 |
| 2008/0049053 A1* | 2/2008 | Asano et al. | 345/697 |
| 2008/0211745 A1* | 9/2008 | Lee et al. | 345/76 |
| 2010/0177023 A1* | 7/2010 | Han | 345/76 |
| 2010/0177087 A1* | 7/2010 | Han | 345/213 |

FOREIGN PATENT DOCUMENTS

| | | |
|---|---|---|
| KR | 0646992 B1 | 11/2006 |
| KR | 10-2008-0070582 A | 7/2008 |
| KR | 10-2010-0004635 A | 1/2010 |
| KR | 10-2010-0008502 A | 1/2010 |

* cited by examiner

*Primary Examiner* — Sanghyuk Park
(74) *Attorney, Agent, or Firm* — Lee & Morse, P.C.

(57) ABSTRACT

A driver and a display device using the same may be provided. The driver, according to an exemplary embodiment includes at least one logic unit, receiving a plurality of clock signals and a plurality of input signals, to generate and sequentially transmit output signals to a plurality of pixel rows included in a display unit, and a buffer unit, receiving a plurality of control signals, to generate and simultaneously transmit the output signals of a same waveform to a plurality of pixels included in the display unit, wherein the at least one logic unit is supplied with a logic power source voltage, and the buffer unit is supplied with a buffer power source voltage, the buffer power source voltage being different from the logic power source voltage.

29 Claims, 15 Drawing Sheets

US 9,311,856 B2

DRIVER WITH SEPARATE POWER SOURCES AND DISPLAY DEVICE USING THE SAME

RELATED APPLICATION

This application claims priority to and the benefit of Korean Patent Application No. 10-2011-006319 filed in the Korean Intellectual Property Office on Jan. 21, 2011, the entire contents of which are incorporated herein by reference.

BACKGROUND

1. Field

Embodiments relate to a driver and a display device including the same. More particularly, embodiments relate to a design circuit of a driver capable of being applied to a sequence light emitting method or a simultaneous light emitting method of the display device and preventing an abnormal circuit operation by an IR-drop under the simultaneous light emitting.

2. Description of the Related Art

Currently, various flat panel displays are being developed that have reduced weight and volume. Weight and volume are drawbacks of a cathode ray tube. A flat panel display may include a liquid crystal display (LCD), a field emission display (FED), a plasma display panel (PDP), and an organic light emitting diode (OLED) display.

Among the flat panel displays, the OLED display, using an organic light emitting diode (OLED) generating light by a recombination of electrons and holes, for the display of images, has a fast response speed, is driven with low power consumption, has excellent luminous efficiency, luminance, and viewing angles.

In the flat panel display, a plurality of pixels is disposed in a matrix form on a substrate to form a display panel. Scan lines and data lines are connected to the respective pixels to selectively transmit data signals to the pixels and display the signals.

In general, the organic light emitting diode (OLED) display is classified as either a passive matrix OLED (PMOLED) display or an active matrix OLED (AMOLED) display.

The active matrix type selectively turns on/off the pixels. The active matrix type is mainly used because of resolution, contrast, and operation speed characteristics.

Recently, as display panels have increased in size, screen quality of a sharp, high picture quality is required. Research and development has been required to obtain a driver that can control light emission of flat panel displays and, simultaneously, generating a driving waveform of an on/off period or a sequential pulse of an on voltage level for providing sharp picture quality and implementing a three-dimensional (3D) video display. These requirements are important because 3D stereoscopic image displays are being used more frequently.

The information in the Background is only for enhancing an understanding of the described technology. Therefore, it may contain information that does not form the prior art known to a person of ordinary skill in the art in this country.

SUMMARY

Embodiments may be directed to a light emission control driver and a display device using the same.

A driver according to an exemplary embodiment may include: at least one logic unit, receiving a plurality of clock signals and a plurality of input signals, to generate and sequentially transmit output signals to a plurality of pixel rows included in a display unit; and a buffer unit, receiving a plurality of control signals, to generate and simultaneously transmit the output signals of a same waveform to a plurality of pixels included in the display unit, wherein the at least one logic unit is supplied with a logic power source voltage, and the buffer unit is supplied with a buffer power source voltage, the buffer power source voltage being different from the logic power source voltage.

The logic power source voltage may include a first logic power source voltage of a predetermined voltage level and a second logic power source voltage of a lower voltage level than the first logic power source voltage.

The buffer power source voltage may include a first buffer power source voltage of a predetermined voltage level and a second buffer power source voltage of a lower voltage level than the first buffer power source voltage.

The at least one logic unit may include a first logic unit, receiving the plurality of clock signals and a first input signal to generate a first output signal, and a second logic unit receiving the plurality of clock signals and a second input signal to generate a second output signal, and the buffer unit may receive the first output signal, the second output signal, a first control signal, and a second control signal to generate a light emission control signal. Thus, at this time, the driver of present embodiments may be a light emission control driver generating a light emission control signal as the output signal.

In a case of a simultaneous driving mode in which the light emission control signals is simultaneously output with a same waveform, the first input signal and the second input signal are transmitted with a gate-off voltage level to the first logic unit and the second logic unit, such that the first logic unit and the second logic unit, respectively are not operated.

In a case of a simultaneous driving mode, in which the light emission control signal is simultaneously output with a same waveform, a pulse width of the light emission control signal is determined by a period difference between a time that the first control signal is transmitted with a pulse of a gate-on voltage and the time that the second control signal is transmitted with the pulse of the gate-on voltage level.

In a case of a sequential driving mode, in which the light emission control signals is sequentially output to a plurality of pixel rows of the display unit, the pulse width of the light emission control signal may be determined by a period difference between a time that the first input signal is transmitted to the first logic unit with a gate-on voltage level and a time that the second input signal is transmitted with the gate-on voltage level to the second logic unit.

A time that a phase of the light emission control signal is changed into a gate-off voltage level is synchronized with a transmission time of a first low level pulse, the first low level pulse being from the plurality of clock signals transmitted to the first logic unit when the first input signal is transmitted with the gate-on voltage level, and a time that the phase of the light emission control signal is changed into the gate-on voltage level is synchronized with a transmission time of a second low level pulse of a clock signal being from the plurality of clock signals transmitted to the second logic unit when the second input signal is transmitted with the gate-on voltage level.

The first logic unit may include: a first switch, switchably operated by a first clock signal among the plurality of clock signals and transmitting a first voltage according to the first input signal to a first node, a second switch switchably operated by the first input signal and transmitting the first logic power source voltage to a second node, a third switch switchably operated corresponding to the first voltage transmitted to the first node and transmitting a second voltage according to a second clock signal among the plurality of clock signals as a first output voltage of the first output signal; a fourth switch switchably operated corresponding to the first logic power source voltage transmitted to the second node and transmitting the first logic power source voltage as a first output voltage of the first output signal; a first capacitor storing the first voltage transmitted to the first node; and a second capacitor storing the first logic power source voltage transmitted to the second node.

The first logic unit may further include: a fifth switch switchably operated by a third clock signal among the plurality of clock signals and transmitting a second logic power source voltage having a lower level than the first logic power source voltage, to the second node; and at least one sixth switch switchably operated by the second logic power source voltage transmitted to the second node and transmitting the first logic power source voltage to the first node.

The second logic unit may include: a seventh switch switchably operated by a third clock signal among the plurality of clock signals and transmitting a third voltage according to the second input signal to a third node, an eighth switch switchably operated by the second input signal and transmitting the first logic power source voltage to a fourth node, a ninth switch switchably operated corresponding to the third voltage transmitted to the third node and transmitting a fourth voltage according to a first clock signal among the plurality of clock signals as a second output voltage level of the second output signal, a tenth switch switchably operated corresponding to the voltage transmitted to the fourth node and transmitting the first logic power source voltage as the second output voltage level of the second output signal; a third capacitor storing the third voltage transmitted to the third node, and a fourth capacitor storing the first logic power source voltage voltage transmitted to the fourth node.

The second logic unit may include: an eleventh switch switchably operated by a second clock signal, among the plurality of clock signals, and transmitting the second logic power source voltage having a lower level than the first logic power source voltage, to the fourth node; and at least one twelfth switch switchably operated by the second logic power source voltage transmitted to the fourth node and transmitting the first logic power source voltage to the third node.

The buffer unit may include: at least one thirteenth switch switchably operated by the first output signal and transmitting a first buffer power source voltage to a fifth node, at least one fourteenth switch switchably operated by the first output signal and transmitting a second buffer power source voltage, the second buffer power source voltage having a lower level than the first buffer power source voltage to a sixth node, at least one fifteenth switch switchably operated by the second output signal and transmitting the second buffer power source voltage to the fifth node, at least one sixteenth switch switchably operated by a first control signal and transmitting the first buffer power source voltage to the fifth node, at least one seventeenth switch switchably operated by the first control signal and transmitting the second buffer power source voltage to the sixth node, at least one eighteenth switch switchably operated by a second control signal and transmitting the first buffer power source voltage to the sixth node, at least one nineteenth switch, switchably operated by the second control signal and transmitting the second buffer power source voltage to the fifth node, a twentieth switch switchably operated by a fifth voltage of the fifth node and transmitting the first buffer power source voltage to the sixth node; a twenty-first switch switchably operated by a sixth voltage transmitted to the sixth node and transmitting the first buffer power source voltage as a voltage level of the light emission control signal, a twenty-second switch switchably operated by the fifth voltage transmitted to the fifth node and transmitting the second buffer power source voltage as the voltage level of the light emission control signal, a fifth capacitor storing the fifth voltage transmitted to the fifth node, and a sixth capacitor storing the sixth voltage transmitted to the sixth node.

Circuit elements forming the first logic unit, the second logic unit, and the buffer unit may be a plurality of transistors, and the plurality of transistors may be realized as only PMOS transistors or only NMOS transistors.

The at least one logic unit may receive the plurality of clock signals, a first input signal, and a first driving control signal to generate scan signals, to sequentially transmit the scan signals to a plurality of pixel rows of the display unit. The buffer unit may receive a second driving control signal, a first control signal, and a second control signal to generate scan signals simultaneously transmitted with a same waveform to the plurality of pixels included in the display unit. Thus, the driver of present embodiments may be a scan driver generating the scan signals as output signals.

The first driving control signal and the second driving control signal may have opposite phases, the buffer unit may be operated corresponding to a gate-on voltage level of the first driving control signal, and the at least one logic unit may be operated corresponding to a gate-on voltage level of the second driving control signal.

In a case that the buffer unit is operated, a pulse width of the scan signal output from the buffer unit may be determined by a period difference between a time that the first control signal is transmitted with a pulse of a gate-on voltage level and a time that the second control signal is transmitted with a pulse of a gate-on voltage level.

In a case that the logic unit is operated, the scan signals sequentially output from the logic unit may be shifted, corresponding to a period that is shifted between the plurality of clock signals.

The at least one logic unit may include: a first transistor, switchably operated by a first clock signal among the plurality of clock signals and transmitting a voltage of the voltage level according to the first input signal to a first node, a second transistor switchably operated by the first input signal and transmitting a first scan logic power source voltage to a second node, a third transistor, switching-operated corresponding to the voltage transmitted to the first node and transmitting a voltage according to a voltage level of a second clock signal among the plurality of clock signals as the voltage level of the scan signal, a fourth transistor switchably operated corresponding to the voltage transmitted to the second node and transmitting the first logic power source voltage as the voltage level of the scan signal, a fifth transistor switchably operated by the first driving control signal and transmitting the first scan logic power source voltage to the first node, a sixth transistor switchably operated by the first driving control signal and transmitting the first logic power source voltage to the second node, a first capacitor storing the first scan logic power source voltage transmitted to the first node, and a second capacitor storing the first scan logic power source voltage transmitted to the second node.

The at least one logic unit may include: a seventh transistor switchably operated by a third clock signal of the plurality of clock signals and transmitting a second scan logic power source voltage of a lower level than the first scan logic power source voltage to the second node, and at least one eighth transistor switchably operated by the second scan logic power source voltage transmitted to the second node, and transmitting the first scan logic power source voltage to the first node.

The buffer unit may include: at least one ninth transistor, switchably operated by the first control signal and transmitting a first scan buffer power source voltage to a third node, at least one tenth transistor switchably operated by the first control signal and transmitting a second scan buffer power source voltage, the second scan buffer power voltage of a lower voltage level than the first scan buffer power source voltage, to the fourth node, at least one eleventh transistor, switchably operated by the second control signal and transmitting the first scan buffer power source voltage to the fourth node, at least one twelfth transistor switchably operated by the second control signal and transmitting the second scan buffer power source voltage to the third node, at least one thirteenth transistor switchably operated by the second driving control signal and transmitting the first scan buffer power source voltage to the third node, at least one fourteenth transistor switchably operated by the second driving control signal and transmitting the first scan buffer power source voltage to the fourth node; a fifteenth transistor switchably operated by the first scan buffer power source voltage transmitted to the third node and transmitting the first scan buffer power source voltage to the fourth node, a sixteenth transistor switchably operated by the first scan buffer source voltage transmitted to the fourth node and transmitting the scan first buffer power source voltage as a voltage level of the scan signal, a seventeenth transistor switchably operated by a second scan buffer power source voltage transmitted to the third node and transmitting the second scan buffer power source voltage as the voltage level of the scan signal; a third capacitor storing the first scan buffer power source voltage transmitted to the third node; and a fourth capacitor storing the first scan buffer power source voltage transmitted to the fourth node.

Circuit elements forming the at least one logic unit and the buffer unit may be a plurality of transistors, and the plurality of transistors may be realized by only PMOS transistors or only NMOS transistors.

A display device of present embodiments may include: a display unit including a plurality of pixels connected to a plurality of scan lines, transmitting a plurality of scan signals, a plurality of data lines transmitting a plurality of data signals, and a plurality of light emission control lines transmitting a plurality of light emission control signals; a scan driver transmitting the plurality of scan signals to the plurality of scan lines; a data driver transmitting the plurality of data signals to the plurality of data lines; and a light emission control driver transmitting the light emission control signals to the plurality of light emission control lines.

The scan driver or the light emission control driver may include at least one logic unit receiving a plurality of clock signals and a plurality of input signals to generate and sequentially transmit output signals to a plurality of pixel rows included in the display unit, and a buffer unit receiving a plurality of control signals to generate and simultaneously transmit the output signals of a same waveform to the plurality of pixels included in the display unit, and the at least one logic unit is supplied with a logic power source voltage and the buffer unit is supplied with a buffer power source voltage, the buffer power source voltage is different from the logic power source voltage.

The scan driver or the light emission control driver may generate the output signals by operating the at least one logic unit in the case of a sequential driving mode, and the scan driver or the light emission control driver may generate the output signals by operating the buffer unit in the case of a simultaneous driving mode.

DETAILED DESCRIPTION

Figure 1:
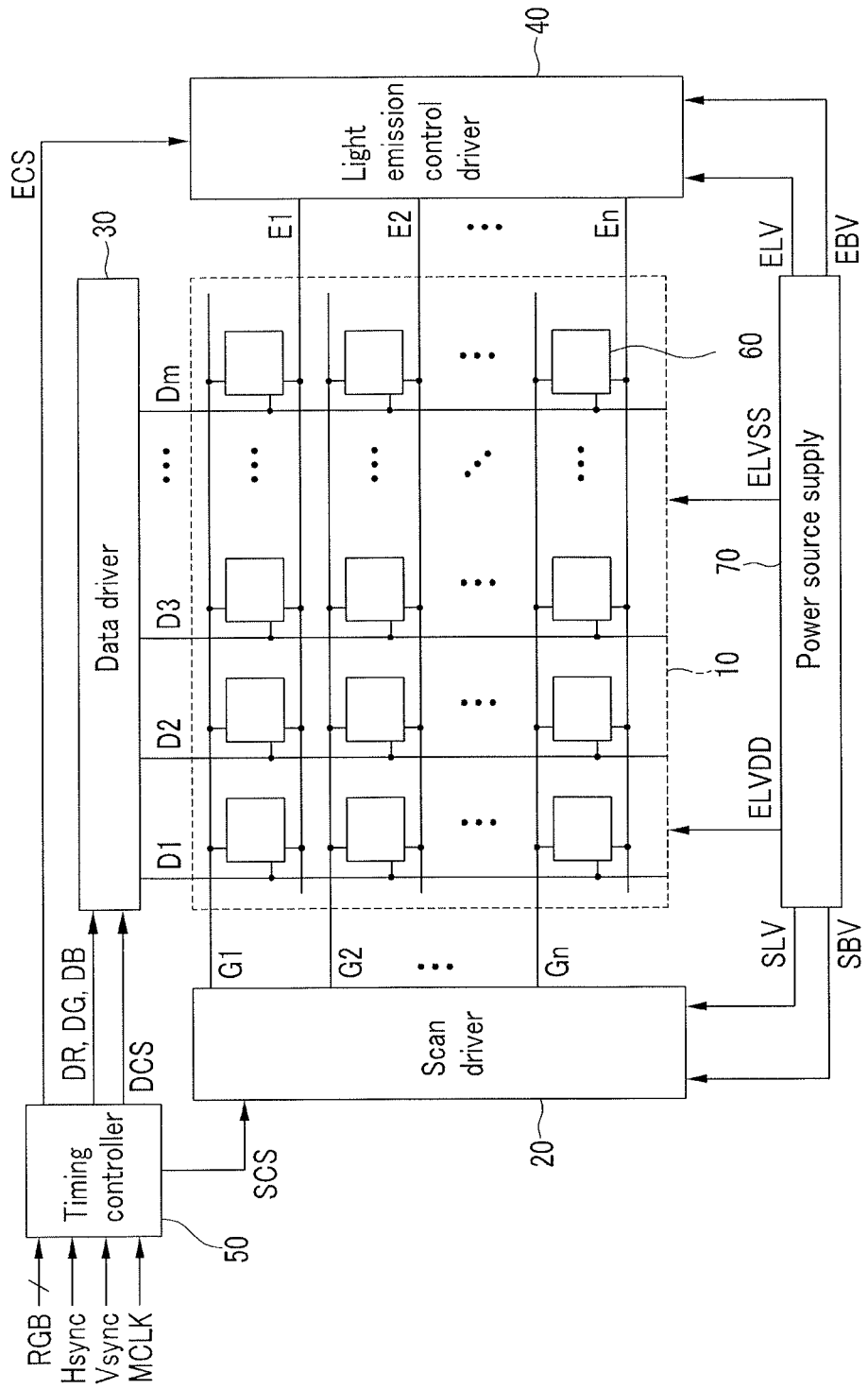
FIG. 1 is a block diagram of a display device according to an exemplary embodiment.

Example embodiments will now be described more fully hereinafter with reference to the accompanying drawings; however, they may be embodied in different forms and should not be construed as limited to the embodiments set forth herein.

In the exemplary embodiments, like reference numerals designate like elements throughout the specification representatively in a first exemplary embodiment, and only elements other than those of the first exemplary embodiment will be described for subsequent embodiments.

The drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

FIG. 1 is a block diagram of a light emitting display device according to an exemplary embodiment.

The light emitting display device shown in FIG. 1 includes a display unit 10, a scan driver 20, a data driver 30, a light emission control driver 40, a timing controller 50, and a power source supply 70.

The display unit 10 includes a plurality of pixels 60 each connected to a corresponding scan line among a plurality of scan lines G1 to Gn, a corresponding light emission control line of a plurality of light emission control lines E1 to En, and a corresponding data line among a plurality of data lines D1 to Dm at intersection regions of the plurality of scan lines G1 to Gn, the plurality of light emission control lines E1 to En, and the plurality of data lines D1 to Dm.

The plurality of pixels 60 are arranged in a matrix form. The plurality of scan lines G1 to Gn for transmitting scan signals and the plurality of light emission control lines E1 to En for transmitting light emission control signals are arranged in a row direction and are in parallel with each other in the arranged form of the pixels 60, and the plurality of data lines D1 to Dm are arranged in a column direction and are parallel with each other.

Each pixel 60 includes a driving transistor and an organic light emitting diode (OLED). A pixel 60 is selected from among the plurality of pixels included in the display unit 10 by the scan signal transmitted through the corresponding scan line from among the plurality of scan lines G1 to Gn. A driving transistor included in the pixel 60 receives a data voltage caused by a data signal transmitted through the corresponding data line from among the plurality of data lines D1 to Dm and supplies a current caused by the data voltage to the organic light emitting diode (OLED) for it to emit light of predetermined luminance. In this instance, light emission of the organic light emitting diode (OLED) of the pixel 60 is controlled by controlling the current flowing in the organic light emitting diode (OLED) by a light emission control signal transmitted through a corresponding light emission control line among the plurality of light emission control lines E1 to En.

The scan driver 20 is connected to the plurality of scan lines G1 to Gn, and generates scan signals to transmit to the plurality of scan lines G1 to Gn. A predetermined row from among a plurality of pixel rows of the display unit 10 is selected by the scan signal, and a data signal is transmitted through data lines connected to a plurality of pixels of the selected row.

The data driver 30 connected to a plurality of data lines D1 to Dm generates a data signal and sequentially transmits the data signal to a plurality of pixels included in a row of a plurality of pixel rows of the display 10 through the plurality of data lines D1 to Dm.

The light emission control driver 40 connected to a plurality of light emission control lines E1 to En generates a light emission control signal and transmits it to a plurality of light emission control lines E1 to En. The light emission control driver 40 controls the pulse width of the light emission control signal by the light emitting driving control signal transmitted by the timing controller 50. Also, the light emission control driver 40 controls the light emitting method of the display unit 10 to be realized as the concurrent light emitting mode or the sequential light emitting mode if needed by equivalently controlling respective pulse voltage levels of the light emission control signals that are transmitted to a plurality of pixels included in a plurality of pixel rows or controlling them to be sequentially changed.

The pixel 60 connected to the light emission control lines E1 to En receives the light emission control signal to determine a time for the current generated by the pixel 60 to flow to the organic light emitting diode (OLED). In this instance, the light emission control driver 40 is realizable by a PMOS transistor or an NMOS transistor, and it can be formed on a substrate without an additional process when the display 10 is formed or it can be formed as a separate chip.

The timing controller 50 uses a horizontal synchronization signal Hsync, a vertical synchronization signal Vsync, and a clock signal MCLK to generate a driving control signal for controlling driving of the scan driver 20, the data driver 30, and the light emission control driver 40. A data driving control signal DCS generated by the timing controller 50 is supplied to the data driver 30, and a scan driving control signal SCS is supplied to the scan driver 20. Also, a light emitting driving control signal ECS is supplied to control an output waveform of the light emission control signal generated by the light emission control driver 40.

The power source supply 70 separately supplies a power source to the display unit 10, the scan driver 20, and the light emission control driver 40.

The power source supply 70 according to an exemplary embodiment, supplies a high potential first power source voltage ELVDD and a low potential second power source voltage ELVSS to the display unit 10.

The power source supply 70 supplies a logic power source voltage and a buffer power source voltage to a logic unit and a buffer unit included in a plurality of scan driving controlling circuits or a plurality of light emission control circuits included in the scan driver 20 or the light emission control driver 40.

The power source supply 70 divides and supplies the logic power source voltage SLV and the buffer power source voltage SBV to the scan driver 20, and divides and supplies the logic power source voltage ELV and the buffer power source voltage EBV to the light emission control driver 40. In present embodiments, the driving power source voltage transmitted from the power source supply 70 to the scan driver 20 or the light emission control driver 40 is divided into two kinds of the logic power source voltage. The buffer power source voltage is supplied such that an influence of the IR drop of the buffer unit does not have an effect in the logic unit.

The logic power source voltages SLV and ELV are supplied to the scan driver 20 or the light emission control driver 40 as the first logic power source voltage of the high level and the second logic power source voltage of the low level. The buffer power source voltages SBV and EBV are supplied as the first buffer power source voltage of the high level and the second buffer power source voltage of the low level. The detailed description of the power source voltage being applied in each driver will be given with reference to drawings below.

Figure 2:
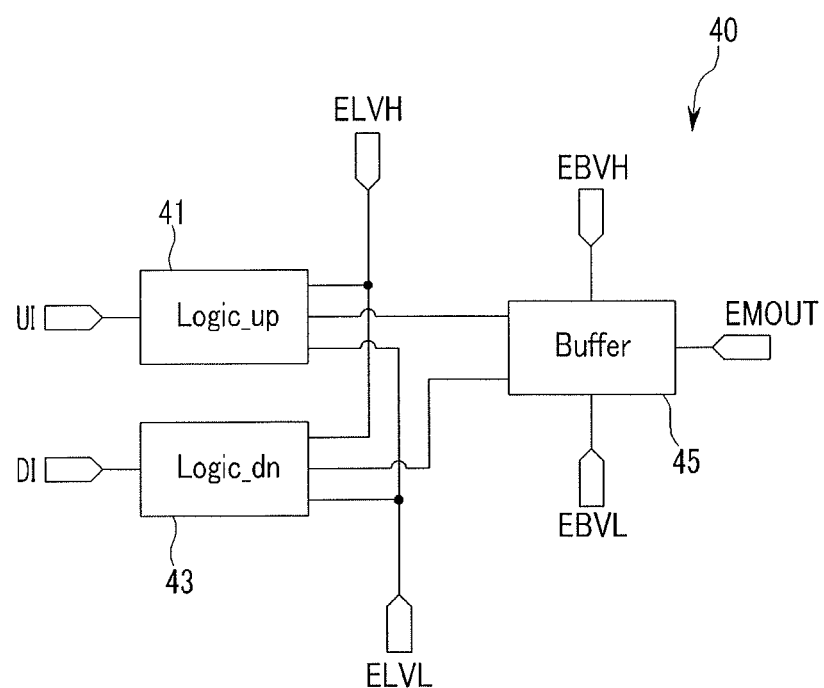
FIG. 2 and FIG. 3 are block diagrams of an exemplary embodiment of the light emission control driver shown in FIG. 1.
Figure 3:
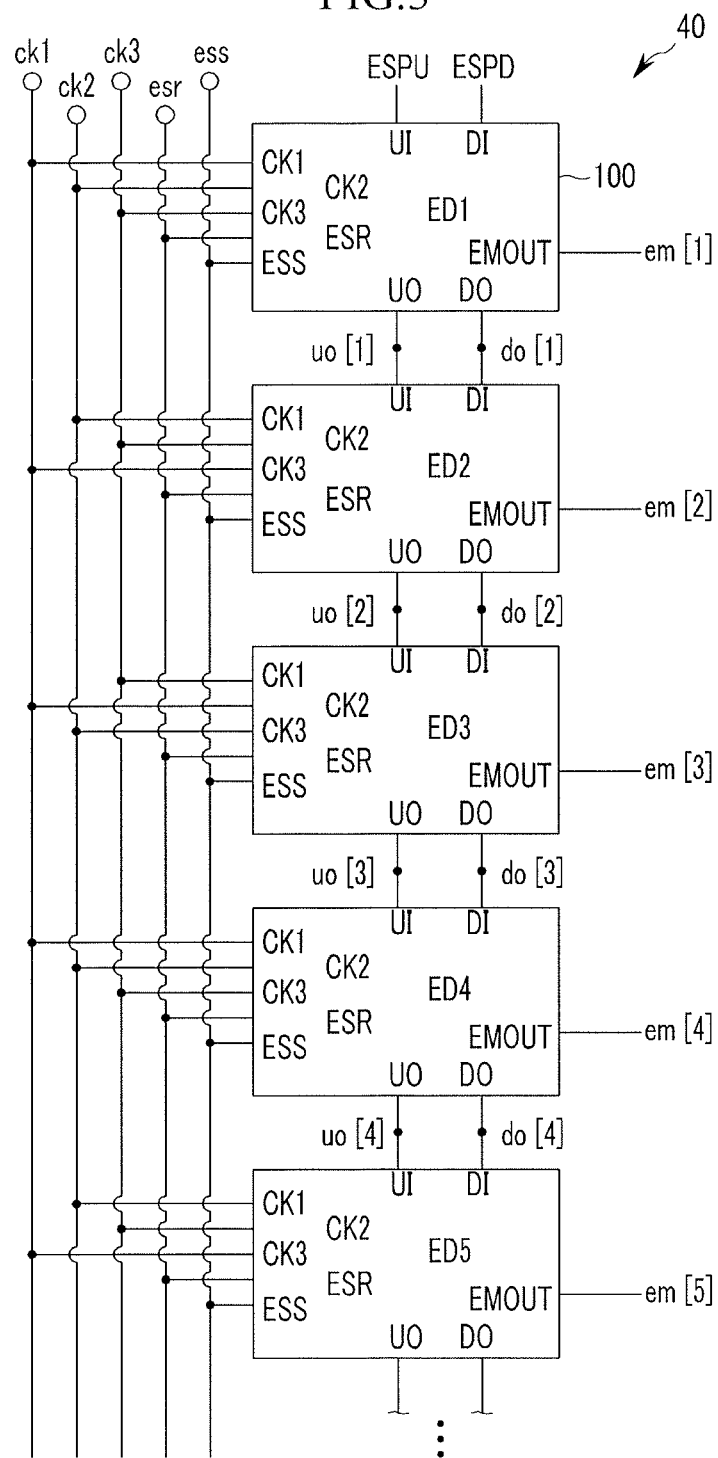

FIG. 2 and FIG. 3 are block diagrams of an exemplary embodiment of the light emission control driver 40 in the display device shown in FIG. 1.

FIG. 2 is a block diagram showing supply of a power source voltage applied to the logic unit and the buffer unit included in a plurality of light emission control circuits included in the light emission control driver 40. FIG. 3 is a block diagram showing a configuration of an input terminal and an output terminal of a plurality of light emission control circuits and transmission of a clock signal or driving control signal applied to the light emission control circuit.

Referring to FIG. 2, the light emission control driver 40 includes a buffer unit 45, a first logic unit 41, and a second logic unit 43. The first logic unit 41 is positioned at an upper stage of the second logic unit 43. The first logic unit 41 receives the input signal from the first input signal terminal UI and the second logic unit 43 receives the input signal from the second input signal terminal DI. The first logic unit 41 and the second logic unit 43 connected to the buffer unit 45 finally output the light emission control signal as the output signal through the output terminal EMOUT of the buffer unit 45. The exemplary embodiment of FIG. 2 is only one exemplary embodiment, and the configuration thereof is not limited thereto.

In FIG. 2, the power source voltage supplied to the first logic unit 41 and the second logic unit 43 and the power source voltage supplied to the buffer unit 45 are respectively divided, and the divided power source voltages are applied from the power source supply 70.

The power source voltage respectively applied to the first logic unit 41 and the second logic unit 43 is a logic power source voltage, and a high potential first logic power source voltage ELVH and a low potential second logic power source voltage ELVL are respectively applied.

The power source voltage applied to the buffer unit 45 is a buffer power source voltage, and a high potential first buffer power source voltage EBVH and a low potential second buffer power source voltage EBVL are applied.

The power source voltages applied to the first logic unit 41, the second logic unit 43, and the buffer unit 45 are divided and applied such that the influence of the IR drop of the buffer unit 45 for the first logic unit 41 and the second logic unit 43 is reduced.

Referring to the light emission control driver 40 shown in FIG. 3, the light emission control driver 40 includes n light emission control circuits ED1 to EDn to generate and transmit a plurality of light emission control signals em[1] to em[n] to n light emission control lines E1 to En.

The n light emission control circuits ED1 to EDn are respectively connected to the light emission control lines E1 to En connected to a plurality of pixel rows of the display unit 10 and sequentially arranged to transmit the light emission control signals em[1] to em[n] for the rows.

Each of the light emission control circuits ED1 to EDn receives the clock signal or the driving control signal through seven input terminals to be driven. Each of the light emission control circuits ED1 to EDn receive three clock signals ck1, ck2, and ck3 transmitted to three clock signal terminals CK1, CK2, and CK3 and four control signals esr, ess, ESPU, and ESPD transmitted to four input signal terminals ESR, ESS, UI, and DI to be operated. However, this is an exemplary embodiment, and a plurality of input signal terminals and clock signal terminals may be variously used.

Referring to FIG. 3, the timing controller 50 generate three clock signals ck1, ck2, and ck3 and transmits them to three clock signal terminals CK1, CK2, and CK3 included in the light emission control circuit 100 of each stage of the light emission control driver 40. Also, four control signals esr, ess, ESPU, ESPD are generated and transmitted to four input signal terminals ESR, ESS, UI, and DI included in the light emission control circuit 100 of each stage.

The control signals transmitted to the input signal terminals UI and DI are applied as starting signals ESPU and ESPD, in the case of the light emission control circuit of the first stage. However, the control signals transmitted to the input signal terminals UI and DI are the output signals uo and do of the previous stage from the light emission control circuit of the next stage.

The clock signals and the control signals supplied from the timing controller 50 to the light emission control driver 40 may be commonly defined as light emitting driving control signals ECS.

In an exemplary embodiment, three clock signals input to three clock signal terminals CK1, CK2, and CK3 included in a plurality of light emission control circuits 100, may be different. The first clock signal ck1, the second clock signal ck2, and the third clock signal ck3 are sequentially and alternately transmitted to three clock signal terminals CK1, CK2, and CK3 included in the light emission control circuit of each stage. In the exemplary embodiment of FIG. 3, the number of clock signal terminals and input clock signals is such that the transmission pattern of the clock signal is repeated every light emission control circuit of three stages.

The first clock signal ck1, the second clock signal ck2, and the third clock signal ck3 are respectively transmitted to the clock signal terminals CK1, CK2, and CK3 of the light emission control circuit ED1 of the first stage. Next, the second clock signal ck2, the third clock signal ck3, and the first clock signal ck1 are respectively transmitted to the clock signal terminals CK1, CK2, and CK3 of the light emission control circuit ED2 of the second stage. The third clock signal ck3, the first clock signal ck1, and the second clock signal ck2 are respectively transmitted to the clock signal terminals CK1, CK2, and CK3 of the light emission control circuit ED3 of the third stage.

The light emission control circuit ED4 of the fourth stage again repeats the transmission pattern of the clock signal of the light emission control circuit ED1 of the first stage, and the transmission pattern of the clock signals is repeated every light emission control circuit of three stages by this method.

Meanwhile, the control signals esr and ess transmitted from the timing controller 50 are transmitted to the input signal terminals ESR and ESS of the light emission control circuit 100 of each stage.

The starting signals ESPU and ESPD transmitted from the timing controller 50 are respectively transmitted to the input signal terminals UI DI of the light emission control circuit ED1 of the first stage. The light emission control driving method of the present invention controls a period in which a pulse of a gate-on voltage level of the starting signals ESPU and ESPD in the sequential light emitting mode is used to control a light emitting duty of the light emission control signal, which will be described with respect to FIG. 4 to FIG. 6.

The light emission control circuits ED2, ED3, . . . of each stage, after the first stage respectively input the output signals output in the driving process to the input signal terminals UI and DI of the light emission control circuit, positioned at the next stage of the corresponding stage as the control signal. For example, the first output signal uo[1] output in the driving process of the light emission control circuit ED1 of the first stage among a plurality of light emission control circuits 100 is transmitted to the input signal terminal UI of the light emission control circuit ED2 of the second stage, and the second output signal do[1] is transmitted to the input signal terminal DI of the second stage light emission control circuit ED2.

The light emission control circuit 100 of each stage generates the light emission control signals em[1], em[2], . . . and transmits them to the corresponding light emission control line among a plurality of light emission control lines through the output signal terminal EMOUT.

Hereafter, the detailed light emission control method according to an exemplary embodiment will be described with reference to the circuit diagram of the light emission control circuit 100 shown in FIG. 4 and the driving timing diagrams of FIG. 5 and FIG. 6 applied thereto.

Figure 4:
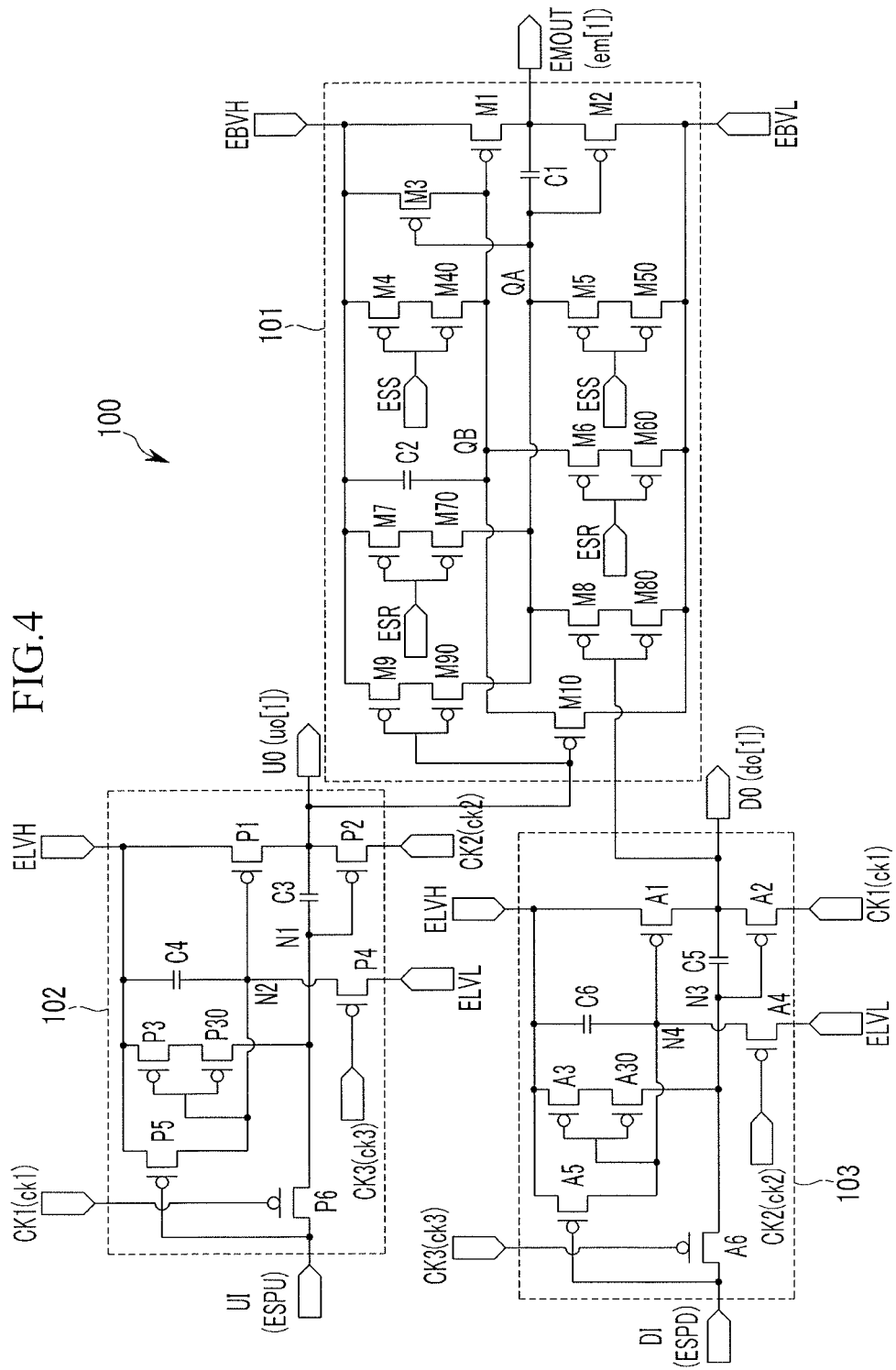
FIG. 4 is a circuit diagram according to an exemplary embodiment of the light emission control circuit shown in FIG. 3.

FIG. 4 is a circuit diagram of a first light emission control circuit 100 among a plurality of light emission control circuits ED1 to EDn forming the light emission control driver 40 according to an exemplary embodiment.

Referring to FIG. 4, the first stage light emission control circuit 100 includes a buffer unit 101 receiving the first control signal esr and the second control signal ess and outputting the light emission control signal em[1] transmitted to the first light emission control line, a first logic unit 102 receiving the first starting signal ESPU and the first clock signal ck1 to the third clock signal ck3 and outputting the first output signal uo[1], and a second logic unit 103 receiving the second starting signal ESPD and the first clock signal ck1 to the third clock signal ck3 and outputting the second output signal do[1].

As described above, the light emission control circuit 100 is the light emission control circuit of the first stage of a plurality of light emission control circuits, such that the plurality of light emission control circuits after the second stage receive the first output signal uo and the second output signal do output from the light emission control circuit of the previous stage instead of the first starting signal ESPU and the second starting signal ESPD as the control signals respectively transmitted to the input signal terminals UI and DI.

The first clock signal ck1 to the third clock signal ck3 are alternately and sequentially transmitted to the first clock signal terminal CK1, the second clock signal terminal CK2, and the third clock signal terminal CK3 of the first logic unit 102 and the second logic unit 103 according to the position of the light emission control circuit.

Referring to FIG. 4, in the light emission control circuit 100 according to an exemplary embodiment, the first output signal uo[1] output by the first logic unit 102 and the second output signal do[1] output by the second logic unit 103 are transmitted to the buffer unit 101.

The buffer unit 101 receives the first output signal uo[1] and the second output signal do[1] and is operated to generate and output the light emission control signal em[1] along with the first control signal esr and the second control signal ess.

The buffer unit 101 includes transistors M1 to M10, a first capacitor C1, and a second capacitor C2. Among them, the transistors M4 to M9 may further include transistors M40 to M90 that are coupled in series. The source electrodes of the transistors M40 to M90 are respectively connected to the drain electrodes of the transistors M4 to M9 and the gate electrodes thereof are respectively connected to the gate electrodes of the transistors M4 to M9 to receive the same signal such that the description of these transistors the same as the description of the transistors M4 to M9.

In the buffer unit 101, each source electrode of the transistors M1, M3, M4, M7, and M9 is connected to the first buffer power source voltage EBVH of a high potential, and the drain electrode of the transistor M1 is connected to one terminal of the first capacitor C1, each drain electrode of the transistors M3 and M4 is connected to the node QB, and each drain electrode of the transistors M7 and M9 is connected to the node QA.

The gate electrode of the transistor M1 is connected to the node QB, the gate electrode of the transistor M3 is connected to the node QA, the gate electrode of the transistor M4 is connected to the second control signal ess, and the gate electrode of the transistor M7 is connected to the first control signal esr. Also, the gate electrode of the transistor M9 is connected to the first output signal uo[1] of the first logic unit 102.

In the buffer unit 101, each source electrode of the transistors M2, M5, M6, M8, and M10 is connected to the second buffer power source voltage EBVL having the lower voltage level than the first buffer power source voltage EBVH of the high potential, and the drain electrode of the transistor M2 is connected to one terminal of the first capacitor C1, each drain electrode of the transistors M6 and M10 is connected to the node QB, and each drain electrode of the transistors M5 and M8 is connected to the node QA.

The gate electrode of the transistor M2 is connected to the node QA to which the other terminal of the first capacitor C1 is connected, the gate electrode of the transistor M5 is connected to the second control signal ess, and the gate electrode of the transistor M6 is connected to the first control signal esr. Also, the gate electrode of the transistor M8 is connected to the second output signal do[1] of the second logic unit 103, and the gate electrode of the transistor M10 is connected to the first output signal uo[1] of the first logic unit 102.

One terminal of the first capacitor C1 of the buffer unit 101 is connected to the output signal terminal EMOUT outputting the light emission control signal em[1], and the other terminal thereof is connected to the node QA. The second capacitor C2 includes one terminal connected to the first buffer power source voltage EBVH and the other terminal connected to the node QB.

In the circuit diagram of FIG. 4, the first logic unit 102 includes transistors P1 to P6, a third capacitor C3, and a fourth capacitor C4. The transistor P3 may be coupled in series with a transistor P30.

The transistor P1 includes the source electrode connected to the first logic power source voltage ELVH of the high potential, the drain electrode connected to the node at which one terminal of the third capacitor C3 and the first output signal terminal UO are connected to each other, and the gate electrode connected to the node N2.

The first logic power source voltage ELVH of the high potential supplied to the buffer unit 101 is different from the first buffer power source voltage EBVH.

The transistor P2 includes the source electrode connected to the second clock signal ck2, the drain electrode connected to the node at which one terminal of the third capacitor C3 and the first output signal terminal UO are connected to each other, and the gate electrode connected to the node N1.

The transistor P3 includes the source electrode connected to the first logic power source voltage ELVH, the drain electrode connected to the node N1, and the gate electrode connected to the node N2. At least one transistor that is coupled in series with the transistor P3 may be further included according to the type of the embodiment. In FIG. 4, the transistor P30 is further included, and the transistor P30 may include the gate electrode that is connected like the gate electrode of the transistor P3, the source electrode connected to the drain electrode of the transistor P3 and the drain electrode connected to the node N1.

The transistor P4 includes the source electrode connected to the second logic power source voltage ELVL of the low potential, the drain electrode connected to the node N2, and the gate electrode connected to the third clock signal ck3.

The voltage of the second logic power source voltage ELVL is the lower level than the first logic power source voltage ELVH. The second logic power source voltage ELVL of the low potential is different from the second buffer power source voltage EBVL of the low potential supplied to the buffer unit 101.

The transistor P5 includes the source electrode connected to the first logic power source voltage ELVH, the drain electrode connected to the node N2, and the gate electrode connected to the input signal terminal UI transmitted the first starting signal ESPU or the first output signal uo output from the output signal terminal UO of the light emission control circuit of the previous stage.

The transistor P6 includes the source electrode connected to the input signal terminal UI, the drain electrode connected to the node N1, and the gate electrode connected to the first clock signal ck1.

The third capacitor C3 includes one terminal connected to the node at which the drain electrode of the transistor P1, the source electrode of the transistor P2, and the output signal terminal UO are connected to each other, and the other terminal connected to the node N1.

The fourth capacitor C4 includes one terminal connected to the first logic power source voltage ELVH and the other terminal connected to the node N2.

A capacitor including one terminal connected to the first logic power source voltage ELVH and the other terminal connected to the output signal terminal UO may be further included.

The second logic unit 103 shown in the circuit diagram of FIG. 4 is similar to the circuit configuration of the above-described first logic unit 102, except for signals that are partially input and output. If the second logic unit 103 is described based on the differences, the second logic unit 103 includes transistors A1 to A6, a fifth capacitor C5, and a sixth capacitor C6. The transistor A3 may be coupled in series to a transistor A30. A capacitor including one terminal connected to the first logic power source voltage ELVH and the other terminal connected to the output signal terminal DO may be included.

Differently from the first logic unit 102, the second logic unit 103 includes an input signal terminal DI, and a signal input to the input signal terminal DI is the second starting signal ESPD transmitted from the timing controller 50 or the second output signal output from the output signal terminal DO of the light emission control circuit of the previous stage in the case of the second logic unit of the light emission control circuit of the stage after the first stage.

The second logic unit 103 outputs the second output signal do[1] through the output signal terminal DO, and the second output signal do[1] is transmitted to the buffer unit 101 and is simultaneously transmitted to the input signal terminal of the light emission control circuit DI of the second stage.

In the second logic unit 103, the source electrode of the transistor A2 is connected to the first clock signal terminal CK1, thereby receiving the first clock signal ck1. The gate electrode of the transistor A4 is connected to the second clock signal terminal CK2, thereby receiving the second clock signal ck2. The transistor A6 includes the source electrode connected to the input signal terminal DI, the drain electrode connected to the node N3, and the gate electrode connected to the third clock signal terminal CK3, and receives the third clock signal ck3 through the third clock signal terminal CK3.

A driving controlling method of the light emission control signal that is generated and output to realize the simultaneous light emitting mode or the sequential light emitting mode in the light emission control circuit will be described through FIG. 5 and FIG. 6.

In a case that the light emission control driving method of the light emission control driver 40 according to an exemplary embodiment is the simultaneous light emitting mode, the display device is controlled by the control signals esr and ess that are input to the light emission control circuit 100 of each stage. In a case that it is the sequential light emitting mode, the display device is controlled by a plurality of clock signals and the starting signals ESPU and ESPD that are input to the light emission control circuit 100 of each stage. In the simultaneous light emitting mode, the light emitting duty of the simultaneous light emitting time and the non-light emitting time of the plurality of generated light emission control signals is controlled according to the pulse width of the control signals esr and ess. In the case of the sequential light emitting mode, the duty of the sequential light emitting time and the non-light emitting time of the plurality of generated light emission control signals is controlled according to the control signals ESPU and ESPD.

Figure 5:
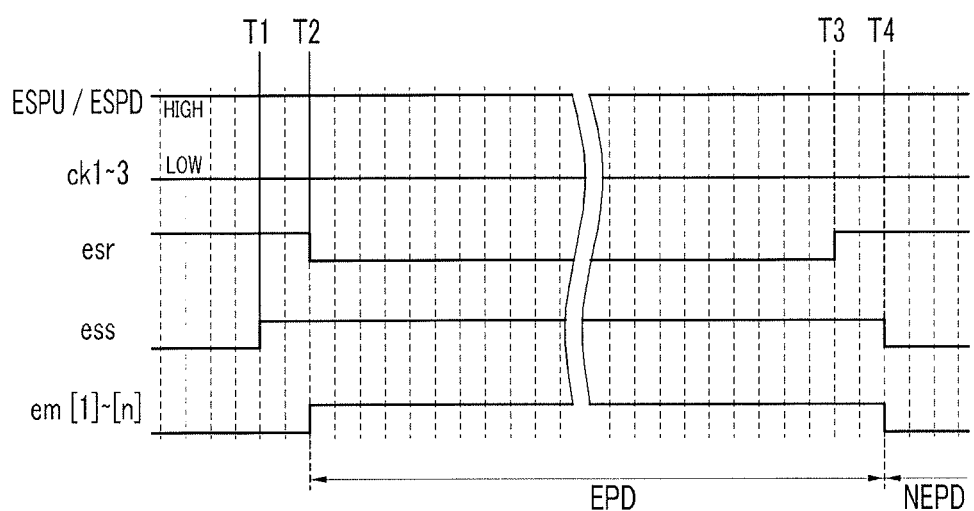
FIG. 5 is a driving timing diagram of the light emission control circuit shown in FIG. 4 and realized by a simultaneous light emitting mode.

The driving timing diagram of FIG. 5 is a waveform for all light emission control signals em[1] to em[n] output to a plurality of light emission control lines in the entire light emission control circuit, as well as the light emission control signal em[1] output through the light emission control circuit of the first stage. FIG. 5 is a timing diagram for the operation of the light emission control circuit 100 controlling the output of a plurality of light emission control signals simultaneously light emitting a plurality of pixels of the display unit 10 or not light emitting them in the simultaneous light emitting mode.

The output of the light emission control signal realizing the simultaneous light emitting method will be described with reference to FIG. 4 and FIG. 5.

In the simultaneous light emitting mode, the first starting signal ESPU and the second starting signal ESPD respectively input to the first logic unit 102 of the light emission control circuit and the input signal terminal UI and DI of the second logic unit 103 are transmitted as the high level voltage. The clock signals ck1 to ck3 transmitted to the first logic unit 102 and the second logic unit 103 are both transmitted as the low level voltage.

The first starting signal ESPU of the first logic unit 102 is the high pulse such that the transistor P5 is turned off. The high level voltage is transmitted to the node N1 through the transistor P6 that is turned on by the first low pulse of the clock signal ck1. The transistor P2 receiving this through the gate electrode is also turned off.

If the transistor P4 is turned on by the low pulse of the third clock signal ck3, the second logic power source voltage ELVL of the low potential is applied to the node N2. Thus, the transistors P1, P3, and P30 are turned on. The first power source voltage VGH of the high potential is applied to the node N1 through the transistors P3 and P30 such that the third capacitor C3 is charged with the high potential. The high potential voltage of the first logic power source voltage ELVH is transmitted with the voltage level of the pulse of the first output signal uo[1] through the transistor P1.

The second logic unit 103 also outputs the second output signal do[1] as the voltage pulse of the high level by the same driving method.

The pulse of the clock signals ck1 to ck3 is maintained with the low level to apply the first logic power source voltage ELVH to the nodes N1 and N3 such that the turn-off of the transistors P2 and A2 is maintained and the portion where the first and second logic units are floated is minimized.

In the circuit diagram of FIG. 4, the first output signal uo and the second output signal do output from the first logic unit 102 and the second logic unit 103 are always maintained with the high level and are transmitted to the input signal terminals UI and DI of the light emission control circuit of the next stage such that the entire light emission control circuit may generate a plurality of light emission control signals realized by the simultaneous light emitting mode.

In the state that all logic unit of the previous stage of the plurality of light emission control circuit of the light emission driver 40 generate the first output signal uo and the second output signal do of the high level, the buffer unit 101 receives the first output signal uo[1] of the first logic unit 102 and the second output signal do[1] of the second logic unit 103 as the voltage of the high level, and simultaneously controls the pulse width of the light emission control signal em[1] through the control of the pulse width of the first control signal esr and the second control signal ess.

At the time T2, the first control signal esr is transmitted as the pulse from the high level to the low level, and the second control signal ess is transmitted as the voltage of the high level. The first buffer power source voltage EBVH of the high potential passes the transistor M7 and is applied to the node QA, and is transmitted to the gate electrodes of the transistors M2 and M3 such that the transistors M2 and M3 are turned off. Simultaneously, the second buffer power source voltage EBVL of the low potential passes the transistor M6 and is applied to the node QB, and is transmitted to the gate electrode of the transistor M1 such that the transistor M1 is turned on. The first buffer power source voltage EBVH of the high potential generates the light emission control signal em[1] with the voltage pulse of the high level through the transistor M1. The first buffer power source voltage EBVH of the high potential transmitted through the transistor M7 is applied to the node QA and is charged to the first capacitor C1 such that the switching turn-off of the transistor M2 is clearly maintained and leakage of the current toward the transistor M2 may be prevented.

When the first output signal uo[1] and the second output signal do[1] are both transmitted with the voltage of the high level, at the time T4, in the case that the second control signal ess is transmitted from the high level to the pulse of the low level and the first control signal esr is the pulse of the high level, the first buffer power source voltage EBVH of the high potential passes through the transistor M4 and is applied to the node QB, and is transmitted to the gate electrode of the transistor M1 such that the transistor M1 is turned off. Simultaneously, the second buffer power source voltage EBVL of the low potential passes through the transistor M5 and is applied to the node QA, and is transmitted to the gate electrodes of the transistors M2 and M3 such that the transistors M2 and M3 are turned on. The voltage of the high potential charged to the first capacitor C1 is quickly discharged, and the second buffer power source voltage EBVL of the low potential is transmitted to the output signal terminal EMOUT through the transistor M2. Therefore, the light emission control signal em[1] is generated as the voltage pulse of the low level. The first buffer power source voltage EBVH of the high potential is transmitted to the node QB through the transistors M3 and M4 such that the switching turn-off of the transistor M1 is correctly maintained and the current leakage toward the transistor M1 may be prevented.

Accordingly, the pulse width of the light emission control signal may be controlled by adjusting the period of the first control signal esr and the second control signal ess that are transmitted as the pulse of the low level from the high level. Like the waveform diagram of FIG. 5, a plurality of light emission control signals output from the light emission control driver 40 are respectively output as the same shape and timing in the simultaneous light emitting mode such that the light emitting of the display unit 10 is simultaneously controlled. In the case that the driving transistor of the plurality of pixels of the display unit 10 is realized as a PMOS transistor during the period EPD of the time T2 to T4 in which the light emission control signals em[1] to em[n] are transmitted as the voltage of the high level, the display unit 10 is simultaneously non-light emitting and light emitting during the remaining period NEPD.

In all pixels of the display unit, current may temporary flow at the operation time of the simultaneous light emitting and non-light emitting. Thus, a large amount of current temporary flows, at the operation time, in the buffer unit 101 such that the IR drop is generated for the buffer power source voltage. However, according to an exemplary embodiment, the power source voltages supplied to the buffer unit 101 and the logic units 102 and 103 are separated from each other such that the power source voltage logic units 102 and 103 are not affected, although the IR drop is generated for the buffer power source voltage of the buffer unit 101, thereby being stably operated.

In an exemplary embodiment, the first control signal esr and the second control signal ess are designed to have opposite phases and the time that the phase of each signal is changed may be the same. However, it may be different from FIG. 5.

If the phases of the first control signal esr and the second control signal ess are adjusted to be simultaneously changed, the transistors receiving the signals are temporary and simultaneously turned on or turned off at a rising time and a falling time such that a period in which a short circuit current flows may be generated. To prevent this, as shown in FIG. 5, the first control signal esr and the second control signal ess may have a phase changing time of 2H.

To smoothly control the simultaneous light emitting or non-light emitting of the plurality of pixels by the light emission control signals em[1] to em[n], a slew rate of the first control signal esr and the second control signal ess may be controlled. For example, if each period of the raising time and the falling time of the first control signal esr and the second control signal ess is controlled to be at least 4H, the phase change of the light emission control signals em[1] to em[n] that are generated is smooth such that temporary splashing of the current may be prevented, thereby realizing the stable module operation.

A generating process of the light emission control signal that is operated with the driving timing of FIG. 6 by using the light emission control circuit according to the exemplary embodiment of FIG. 4 to realize the sequential light emitting method of the light emitting display device will be described.

Figure 6:
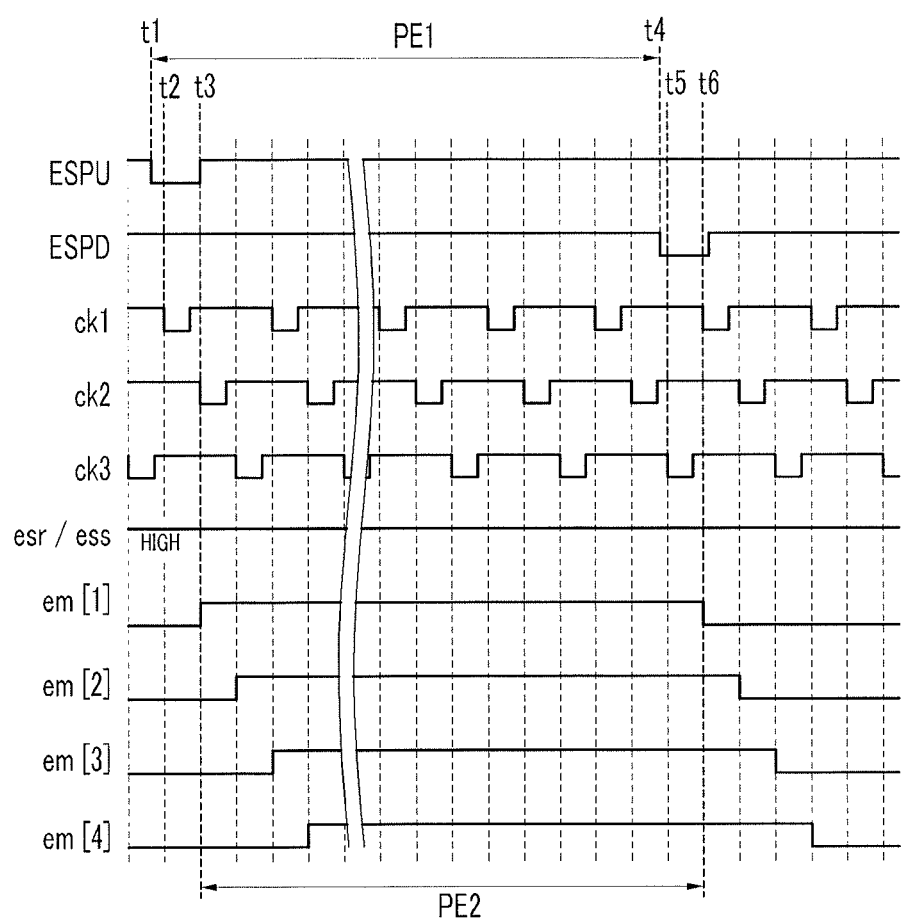
FIG. 6 is a driving timing diagram of the light emission control circuit shown in FIG. 4 and realized by a sequential light emitting mode.

For the sequential light emitting mode of FIG. 6, the first control signal esr and the second control signal ess are maintained as the pulse of the high level. Thus, the corresponding transistors M4, M40, M5, M50, M6, M60, M7, and M70 of the buffer unit 101 receiving the first control signal esr and the second control signal ess during the period of the sequential light emitting mode are turned off.

If the phase of the first starting signal ESPU is changed from the high level to the low level at the time t1 and is transmitted, the transistor P5 is turned on and the first logic power source voltage ELVH of the high potential is transmitted to the node N2. Also, the node N2 is applied with the high potential voltage such that the transistor P1 is turned off.

At the time t2, if the first clock signal ck1 is transmitted to the transistor P6 with the low state, the transistor P6 is turned on and the voltage of the low level state is transmitted to the node N1. Accordingly, the third capacitor C3 is charged and the transistor P2 is turned on. Thus, the pulse of the first output signal uo[1] is generated corresponding to the voltage level of the pulse of the second clock signal ck2 transmitted through the transistor P2. If the first output signal uo[1] is in the high state according to the voltage level of the pulse of the second clock signal ck2 at the time t2 and the phase of the second clock signal ck2 is changed to the low state at the time t3, the first output signal uo[1] is transmitted as the low level from the time t3.

The first output signal uo[1] is transmitted with the low state to the input signal terminal UI of the light emission control circuit of the next stage and is simultaneously input to the buffer unit 101.

If the first output signal uo[1] of the low state is transmitted, the transistors M9, M90, and M10 of the buffer unit 101 are turned on, the first buffer power source voltage EBVH is applied to the node QA by the transistors M9 and M90 and charges the first capacitor C1 with the high potential voltage, and the transistors M2 and M3 are turned off. On the other hand, the second buffer power source voltage EBVL is transmitted to the node QB through the transistor M10. The second capacitor C2 is charged with the low potential voltage. The transistor M1 is turned on such that the light emission control signal em[1], as the high level of the first buffer power source voltage EBVH, is output.

The light emission control signal em[1] is output as the high level by the charging voltage of the first capacitor C1 and the second capacitor C2 during a predetermined period (a period PE2 in FIG. 6). During the period PE2 when the light emission control signal em[1] is output as the high level, in the case that the pixels included in the first pixel row of the display unit 10 include the PMOS transistor, the pixels receive the light emission control signal em[1] to be non-light emitting.

The second starting signal ESPD transmitted to the input signal terminal DI of the second logic unit 103 is in the high state during the period PE2.

If the phase of the second starting signal ESPD transmitted to the input signal terminal DI of the second logic unit 103 is changed from the high state to the low state at the time t4, the transistor A5 is turned on and the first logic power source voltage ELVH of the high potential is transmitted to the node N4. Also, the transistor A1 is turned off according to the application of the high potential voltage of the node N4.

If the third clock signal ck3 is transmitted to the transistor A6 with the low state at the time t5, the transistor A6 is turned on and the voltage of the low level state is transmitted to the node N3. Accordingly, the fifth capacitor C5 is charged and the transistor A2 is turned on. Thus, the pulse of the second output signal do[1] is generated corresponding to the voltage level of the pulse of the first clock signal ck1 transmitted through the transistor A2. If the phase of the first clock signal ck1 that is in the high state at the time t5 is changed into the low state at the time t6, the second output signal do[1] is transmitted as the low level from the time t6.

The third control signal SPU maintains the high state from the time t3 such that the first logic unit 102 is not operated regardless of the pulse level of the clock signals ck1 to ck3. The buffer unit 101 is only transmitted the second output signal do[1] of the low level.

The second output signal do[1] is transmitted with the low state to the input signal terminal DI of the light emission control circuit of the next stage.

If the second output signal do[1] of the low state is transmitted at the time t6, the transistors M8 and M80 of the buffer unit 101 are turned on, the second buffer power source voltage EBVL of the low potential is applied to the node QA by the transistors M8 and M80, the first capacitor C1 is quickly discharged, and the transistors M2 and M3 are turned on. Thus, the first buffer power source voltage EBVH of the high potential is applied to the node QB through the transistor M3 and the transistor M1 is turned off. Simultaneously, the low level voltage of the second buffer power source voltage EBVL is transmitted such that the light emission control signal em[1] is output as the low level. The light emission control signal em[1] is output as the low level from the time t6 by the charging voltage of the first capacitor C1 and the second capacitor C2. During the period that the light emission control signal em[1] is output as the low level, in the case that the pixels included in the first pixel row of the display unit 10 include the PMOS transistor, the light emission control signal em[1] is transmitted for the light emitting.

The second stage light emission control circuit respectively receives the first output signal uo[1] and the second output signal do[1] of the low level at the input signal terminal UI and DI.

The clock signals transmitted to the first logic unit 102 of the second stage light emission control circuit and the clock signal terminals CK1 to CK3 of the second logic unit 103 are different from the first stage light emission control circuit, as shown in FIG. 3. In the second stage light emission control circuit, the clock signal terminal CK1 is input with the second clock signal ck2, the clock signal terminal CK2 is input with the third clock signal ck3, and the clock signal terminal CK3 is transmitted the first clock signal ck1, and thereby it is driven according to each timing.

The light emission control signal em[2] output from the second stage light emission control circuit is generated to be increased to the high level later than the first light emission control signal em[1] by 1 horizontal cycle and have the same light emitting duty. The light emission control signals output in the light emission control circuit of each stage may be output while having the phase difference that is sequentially delayed by the phase difference of the clock signals.

In the exemplary embodiment of FIG. 6, a plurality of light emission control signals that are shifted by one horizontal cycle 1H and have the same light emitting duty are generated.

As described above, a light emission control signal capable of being applied to the simultaneous light emitting mode and the sequential light emitting mode of the display unit 10 may be generated from the light emission control circuit having the circuit configuration of one exemplary embodiment.

Figure 7:
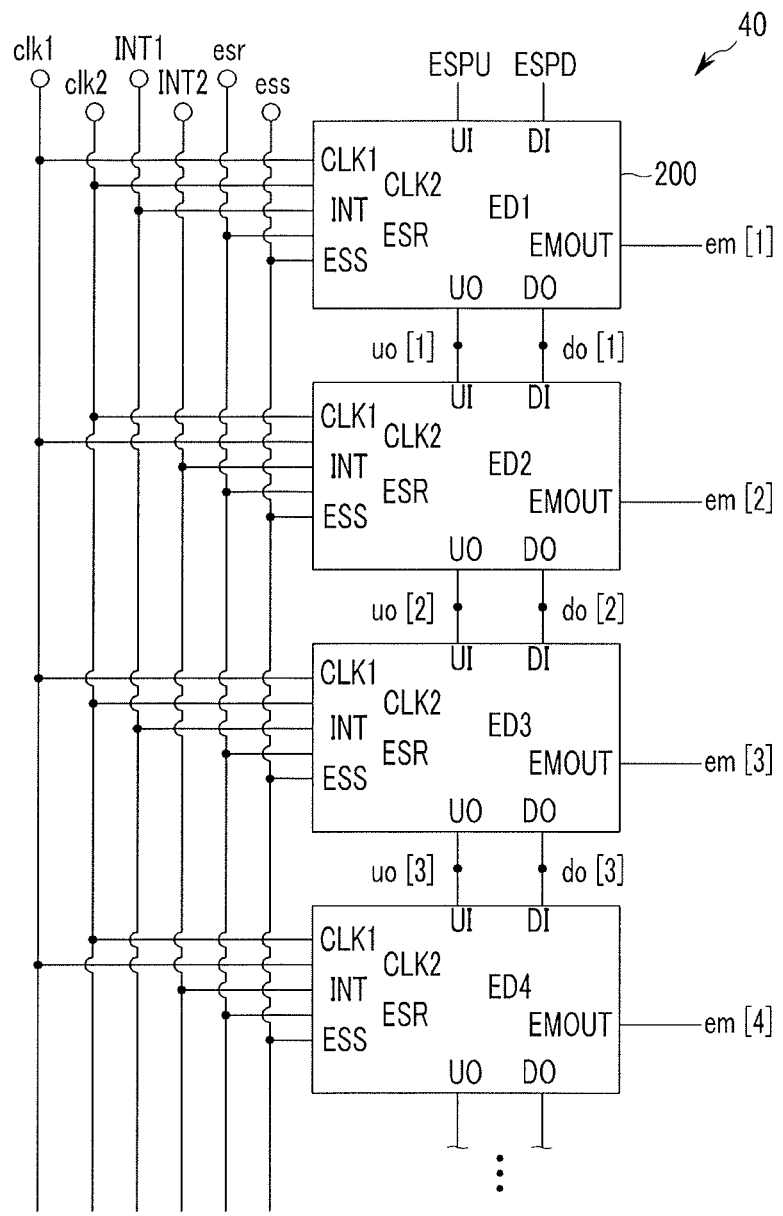
FIG. 7 is a block diagram of another exemplary embodiment of the light emission control driver shown in FIG. 1.

FIG. 6 is a block diagram of an exemplary embodiment that is different from the light emission control driver of FIG. 1. FIG. 7 is a circuit diagram of an exemplary embodiment of the light emission control circuit shown in FIG. 6.

The exemplary embodiment shown in FIG. 7 to FIG. 10 is similar to the above-described exemplary embodiment of FIG. 3 to FIG. 6, such that differences from the exemplary embodiment of FIG. 3 to FIG. 6 will be described hereafter.

Referring to FIG. 7, the light emission control driver 40 according to this exemplary embodiment reduces the number of clock signal terminals to two, CLK1 and CLK2, and a start signal terminal INT is added.

The number of control signals transmitted from the timing controller 50 to the light emission control driver 40 is increased by one compared with the exemplary embodiment of FIG. 3. That is, the timing controller 50 transmits the first clock signal clk1 and the second clock signal clk2 input to the clock signal terminals CLK1 and CLK2, the first start signal INT1 and the second start signal INT2 selectively transmitted to the start signal terminal INT, the first control signal esr, the second control signal ess, the first starting signal ESPU, and the second starting signal ESPD.

The first clock signal clk1 and the second clock signal clk2 are alternately and sequentially transmitted to a plurality of light emission control circuits forming the light emission control driver 40.

The first start signal INT1 and the second start signal INT2 are crossed and transmitted to each start signal terminal INT of the plurality of light emission control circuits. The rest is similar to the exemplary embodiment of FIG. 3, such that the description thereof is omitted.

Figure 8:
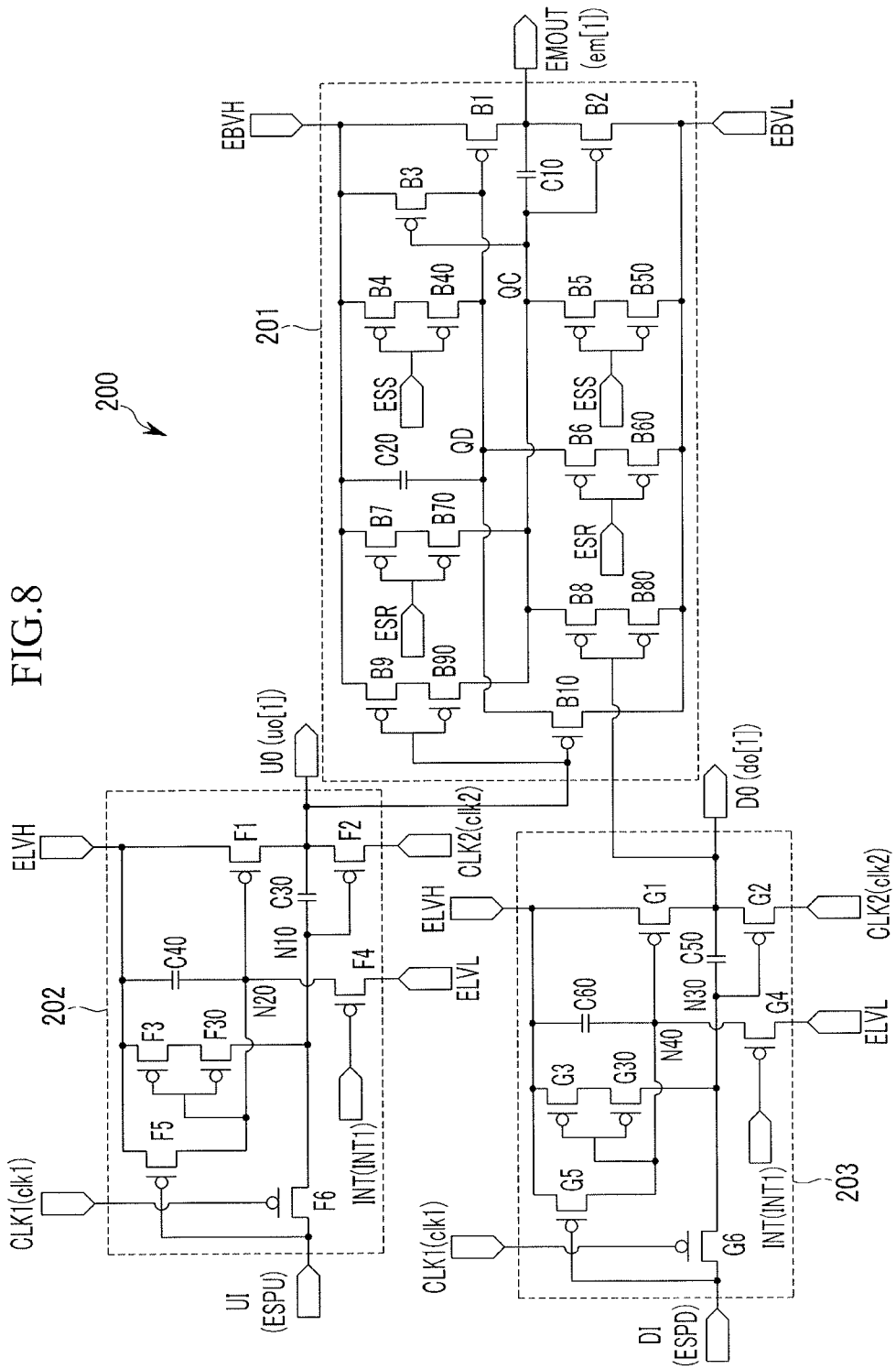
FIG. 8 is a circuit diagram according to an exemplary embodiment of the light emission control circuit shown in FIG. 7.

FIG. 8 is a circuit diagram of a first stage light emission control circuit 200 among a plurality of light emission control circuits according to the exemplary embodiment of FIG. 7.

The circuit diagram of FIG. 8 is not largely different from that of the exemplary embodiment of FIG. 4. However, the first clock signal clk1 is transmitted to the clock signal terminal CLK1 connected to the gate electrode of the transistor F6 of a first logic unit 202, and the first start signal INT1 is transmitted to the start signal terminal INT connected to the gate electrode of the transistor F4. When the source electrode of the transistor F2 is connected to the clock signal terminal CLK2 and the transistor F2 is turned on, the voltage level of the second clock signal clk2 is transmitted to output as the voltage pulse of the first output signal uo[1].

The clock signal terminal CLK1 connected to the gate electrode of the transistor G6 of a second logic unit 203 is transmitted the first clock signal clk1, the start signal terminal INT connected to the gate electrode of the transistor G4 is transmitted the first start signal INT1, and the source electrode of the transistor G2 is connected to the clock signal terminal CLK2 such that the transistor G2 is turned on, and the voltage level of the second clock signal clk2 is transmitted to output as the voltage pulse of the second output signal do[1].

According to the exemplary embodiment of FIG. 4, the circuit configuration of the first logic unit 102 and the second logic unit 103, and the input clock signals, are different from each other. However, in the exemplary embodiment of the FIG. 7, the circuit configuration of the first logic unit 202 and the second logic unit 203, and the input clock signal and the start signal, are the same.

Figure 9:
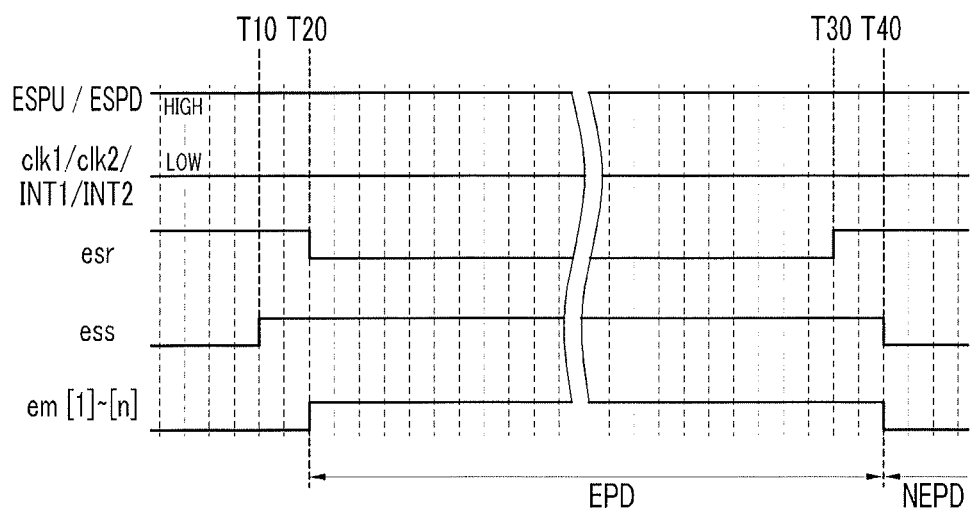
FIG. 9 is a driving timing diagram of the light emission control circuit shown in FIG. 8 and realized by a simultaneous light emitting mode.

FIG. 9 shows the timing diagram of the signals that are driven in the light emission control circuit according to the exemplary embodiment of FIG. 8 in the case of the simultaneous light emitting mode.

FIG. 9 is the driving method controlling all pulse widths of a plurality of light emission control signals em[1] to em[n] by the control of the pulse width of the first control signal esr and the second control signal ess in the state that the first starting signal ESPU and the second starting signal ESPD are transmitted as the voltage of the high level such that it is the same as the driving method according to the exemplary embodiment of FIG. 5.

In the exemplary embodiment, the abnormal operation of the circuit due to the IR drop generated when the potential differences for all light emission control signals are simultaneously changed to the voltage between the high level and the low level may be reduced by separating the power source voltages that are applied to the buffer units and the logic units.

Figure 10:
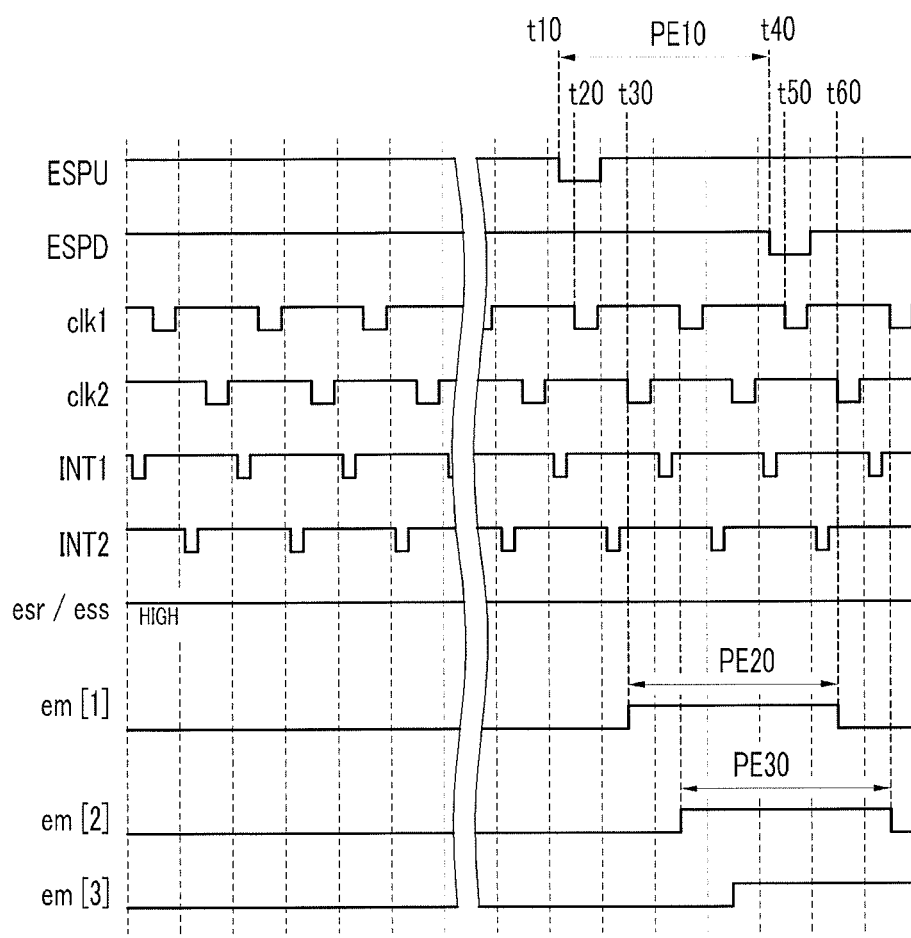
FIG. 10 is a driving timing diagram of the light emission control circuit shown in FIG. 8 and realized by a sequential light emitting mode.

FIG. 10 is a driving timing diagram when the light emission control circuit is realized by the sequential light emitting mode shown in FIG. 8.

In the sequential light emitting mode, the first control signal esr and the second control signal ess are maintained as the pulse of the high level. Thus, the corresponding transistors B4, B40, B5, B50, B6, B60, B7, and B70 of the buffer unit 101 are in the turned-off state during the period of the sequential light emitting mode.

If the first starting signal ESPU is changed into the phase of the low level at the time t10, the transistor F5 is turned on and the first logic power source voltage ELVH is transmitted to the node N20. Also, the transistor F1 is turned off according to the application of the high voltage of the node N20.

If the first clock signal clk1 is transmitted to the transistor F6 as the low state at the time t20, the transistor F6 is turned on and the voltage of the low level state is transmitted to the node N10. Accordingly, the third capacitor C30 is charged and the transistor F2 is turned on. Thus, the first output signal uo[1] is generated corresponding to the voltage level of the pulse of the second clock signal clk2. Accordingly, the first output signal uo[1] is transmitted as the low state by the low level pulse of the second clock signal clk2 from the time t30.

The first output signal uo[1] is transmitted as the low state to the input signal terminal UI of the light emission control circuit of the next stage and is simultaneously input to a buffer unit 201.

If the first output signal uo[1] is transmitted as the low state, the buffer unit 201 outputs the light emission control signal em[1] as the high level of the first buffer power source voltage EBVH from the time t30 through the process as described in FIG. 6.

The light emission control signal em[1] is output as the high level by the charging voltage of the first capacitor C10 and the second capacitor C20 included in the buffer unit 201 during the period PE20. In the case that the pixel included in the first pixel row of the display unit 10 includes the PMOS transistor, during the period PE20 when the light emission control signal em[1] is output as the high level, the light emission control signal em[1] is transmitted for the non-light emitting.

The second starting signal ESPD transmitted to the input signal terminal DI of the second logic unit 203 during the period PE10 is in the high state such that the second logic unit 203 is not operated, and then the phase of the second starting signal ESPD transmitted to the input signal terminal DI of the second logic unit 203 is changed from the high state to the low state at the time t40. The transistor G5 is turned on and the first logic power source voltage ELVH is transmitted to the node N40. The transistor G1 is turned off according to the application of the high potential voltage of the node N40.

If the first clock signal clk1 is transmitted as the low state to the transistor G6 at the time t50, the transistor G6 is turned on, and the voltage of the low level state of the second starting signal ESPD is applied to the node N30. The fifth capacitor C50 is charged with the voltage of the node N30 and the transistor G2 is turned on. Thus, the pulse of the second output signal do[1] is generated corresponding to the voltage level of the pulse of the second clock signal clk2 transmitted through the transistor G2. Therefore, it is in the high state according to the voltage level of the pulse of the second clock signal clk2 at the time t50. If the phase of the second clock signal clk2 is changed into the low state at the time t60, the second output signal do[1] is transmitted as the low level from the time t60.

The second output signal do[1] is transmitted as the low state to the input signal terminal DI and the buffer unit 201 of the light emission control circuit of the next stage.

If the second output signal do[1] of the low state is transmitted to the buffer unit 201 at the time t60, the light emission control signal em[1] is output as the low level through the process as described in FIG. 6.

The light emission control signal em[1] is output as the low level by the charging voltage of the first capacitor C10 and the second capacitor C20 during the period by the non-light emitting period (the period PE20) after the time t60. In the case that the pixels included in the first pixel row of the display unit 10 includes the PMOS during the period when the light emission control signal em[1] is output as the low level, the light emission control signal em[1] is transmitted such that the pixels emit light.

The above-described process is repeated such that the light emission control circuits of the stage after the second stage are shifted by one horizontal cycle 1H and a plurality of light emission control signals having the same light emitting duty are generated.

In the exemplary embodiment of FIG. 10, when the first start signal INT1 input to the first logic unit 202 and the second logic unit 203 is transmitted as the pulse of the low level, the transistors F4 and G4 are turned on and the second logic power source voltage ELVL is applied to the nodes N20 and N40. The transistors F3, F30, and F1 and the transistors G3, G30, and G1 are turned on to apply the first logic power source voltage ELVH to the nodes N10 and N30 such that the turn-off of the transistors F2 and G2 is maintained and the portion in which the logic units are floated is minimized.

In an exemplary embodiment, a plurality of transistors forming the light emission control circuits may be realized by a signal shape of the PMOS transistor or the NMOS transistor, and thereby the polarity of the driving timing showing the operation of the light emission control circuit may be changed.

Figure 11:
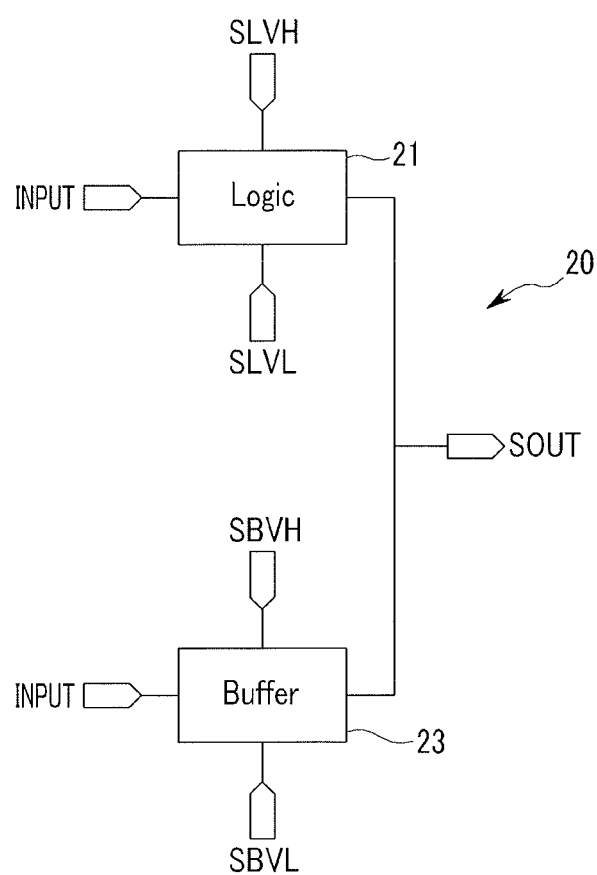
FIG. 11 and FIG. 12 are block diagrams of an exemplary embodiment of the scan driver shown in FIG. 1.
Figure 12:
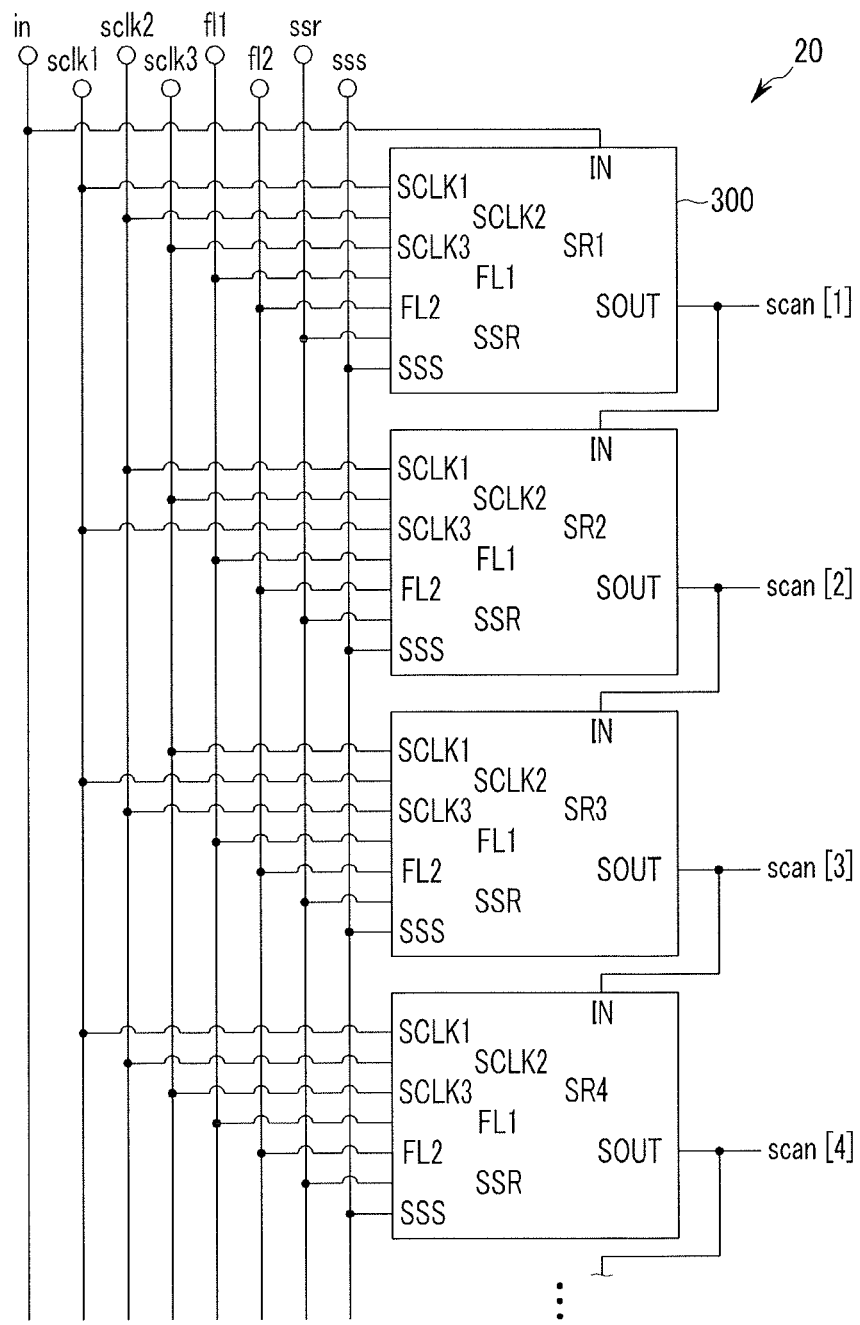

FIG. 11 and FIG. 12 are block diagrams of an exemplary embodiment of the scan driver 20 among the display device shown in FIG. 1.

Particularly, FIG. 11 is a block diagram focusing a supply of a power source voltage applied to a scan logic unit 21 and a scan buffer unit 23 included in a plurality of scan driving controlling circuits of the scan driver 20, and FIG. 12 is a block diagram showing a configuration of an input terminal and an output terminal of a plurality of scan driving controlling circuit and focusing on transmission of a clock signal or driving control signals applied to a scan driving controlling circuit.

Referring to FIG. 11, the scan driver 20 includes the scan logic unit 21 and the scan buffer unit 23. The scan logic unit 21 is positioned at the upper stage of the scan buffer unit 23. The scan logic unit 21 and the scan buffer unit 23 receive a plurality of various input signals through the input signal terminal. In FIG. 11, all terminals input with the signals transmitted to the scan logic unit 21 and the scan buffer unit 23 are commonly defined as input signal terminals INPUT.

The signals output from the scan logic unit 21 and the scan buffer unit 23 are selected according to the driving method and are finally output as the scan signals that are the output signals of the corresponding stage through the output terminal SOUT. The exemplary embodiment of FIG. 11 is only one exemplary embodiment, and this configuration is not limited thereto.

In FIG. 11, the power source voltages supplied to the scan logic unit 21 and the scan buffer unit 23 are separated, and the separated power source voltages are applied from the power source supply 70.

The power source voltages respectively applied to the scan logic unit 21 are scan logic power source voltages, and a high potential first scan logic power source voltage ELVR and a low potential second scan logic power source voltage ELVL are respectively applied.

The power source voltages applied to the scan buffer unit 23 are scan buffer power source voltages, and a high potential first scan buffer power source voltage EBVH and a low potential second scan buffer power source voltage EBVL are applied.

The power source voltages transmitted to the scan logic unit 21 and the scan buffer unit 23 are divided and transmitted such that the influence of the IR drop of the scan buffer unit 23 for the scan logic unit 21 may be remarkably reduced.

Referring to the scan driver 20 shown in FIG. 12, the scan driver 20 includes n scan driving controlling circuits SR1 to SRn to generate and transmit a plurality of scan signals scan[1] to scan[n] to n scan lines G1 to Gn.

Preferably, the n scan driving controlling circuits SR1 to SRn are respectively connected to the scan lines G1 to Gn connected to a plurality of pixel rows of the display unit 10 and sequentially arranged to transmit the scan signals scan[1] to scan[n] for the rows.

Each of the scan driving controlling circuits SR1 to SRn receives the clock signal or the driving control signal through eight input terminals to be driven. That is, each of the scan driving controlling circuits SR1 to SRn is driven by receiving three clock signals sclk1, sclk2, and sclk3 transmitted to three clock signal terminals SCLK1, SCLK2, and SCLK3, four input signal terminals SSR, SSS, FL1, and FL2, and four control signals ssr, sss, fl1, and fl2. However, this is an exemplary embodiment, and a plurality of input signal terminals and clock signal terminals may be variously used.

The timing controller 50 generates three clock signals sclk1, sclk2, and sclk3 and transmits them to three clock signal terminals SCLK1, SCLK2, and SCLK3 included in each of stage scan driving control circuits 300 of each stage of the scan driver 20. Four control signals ssr, sss, fl1, and fl2 are generated and transmitted to four input signal terminals SSR, SSS, FL1, and FL2 included in the scan driving control circuit 300 of each stage. The starting signal in is transmitted to the input signal terminal IN of the scan driving control circuit 300 of the first stage.

The clock signals and the control signals supplied from the timing controller 50 to the scan driver 20 may be commonly defined as scan driving control signals SCS.

In an exemplary embodiment, three clock signals input to three clock signal terminals SCLK1, SCLK2, and SCLK3 included in a plurality of scan driving control circuits 300 may be different. The first clock signal sclk1, the second clock signal sclk2, and the third clock signal sclk3 are sequentially and alternately transmitted to three clock signal terminals SCLK1, SCLK2, and SCLK3 included in the light emission control circuit of each stage. In the exemplary embodiment of FIG. 12, the number of clock signal terminals and input clock signals is three such that the transmission pattern of the clock signals is repeated every scan driving controlling circuit of three stages.

The first clock signal sclk1, the second clock signal sclk2, and the third clock signal sclk3 are respectively transmitted to the clock signal terminals SCLK1, SCLK2, and SCLK3 of the scan driving controlling circuit SR1 of the first stage. The second clock signal sclk2, the third clock signal sclk3, and the first clock signal sclk1 are respectively transmitted to the clock signal terminals SCLK1, SCLK2, and SCLK3 of the scan driving controlling circuit SR2 of the second stage. The third clock signal sclk3, the first clock signal sclk1, and the second clock signal sclk2 are respectively transmitted to the clock signal terminals SCLK1, SCLK2, and SCLK3 of the scan driving controlling circuit SR3 of the third stage.

The scan driving controlling circuit SR4 of the fourth stage again repeats the transmission pattern of the clock signal of the scan driving controlling circuit SR1 of the first stage, and the transmission pattern of the clock signals is repeated every scan driving controlling circuit of three stages by this method.

The control signals ssr and sss transmitted from the timing controller 50 are transmitted to the input signal terminals SSR and SSS of the scan driving control circuit 300 of each stage. The control signals fl1 and fl2 transmitted from the timing controller 50 are transmitted to the input signal terminals FL1 and FL2.

The starting signal in transmitted from the timing controller 50 is transmitted to the input signal terminal IN of the first stage scan driving controlling circuit SR1.

The driving process of the input signal and clock signal will be described in detail in FIG. 14 to FIG. 15. However, the scan driving method of present embodiments select the operation of the scan logic unit or the scan buffer unit by the control signals fl1 and fl2, the duty ratio of the scan signal is controlled by the control signals ssr and sss in the simultaneous driving mode, and the duty ratio of the scan signals that are sequentially generated is controlled by the clock signals in the sequential driving mode.

The scan signal output from the output terminal SOUT of each scan driving controlling circuit is transmitted to the input signal terminal IN of the scan driving controlling circuit of the next stage.

Figure 13:
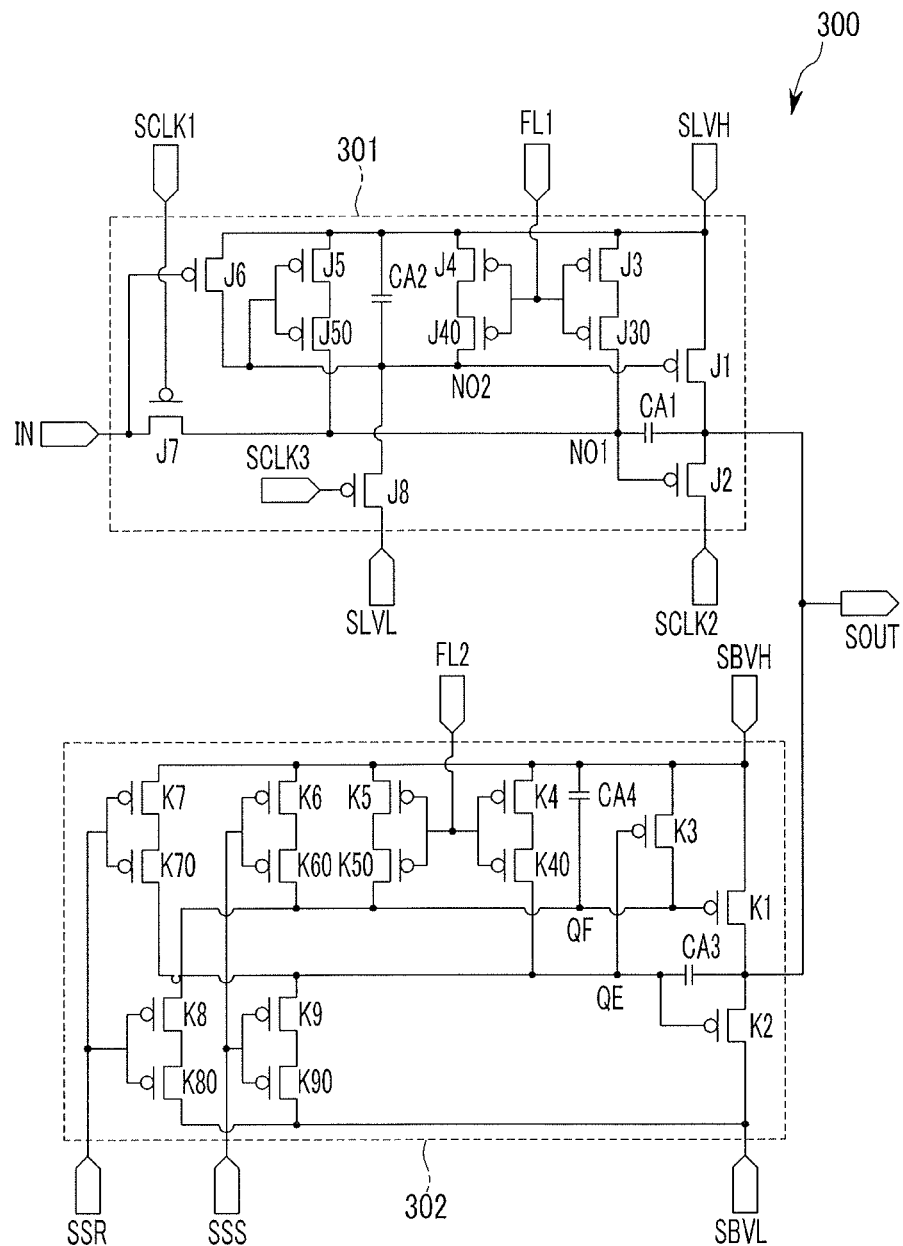
FIG. 13 is a circuit diagram of the scan driving controlling circuit shown in FIG. 12 according to an exemplary embodiment.
Figure 14:
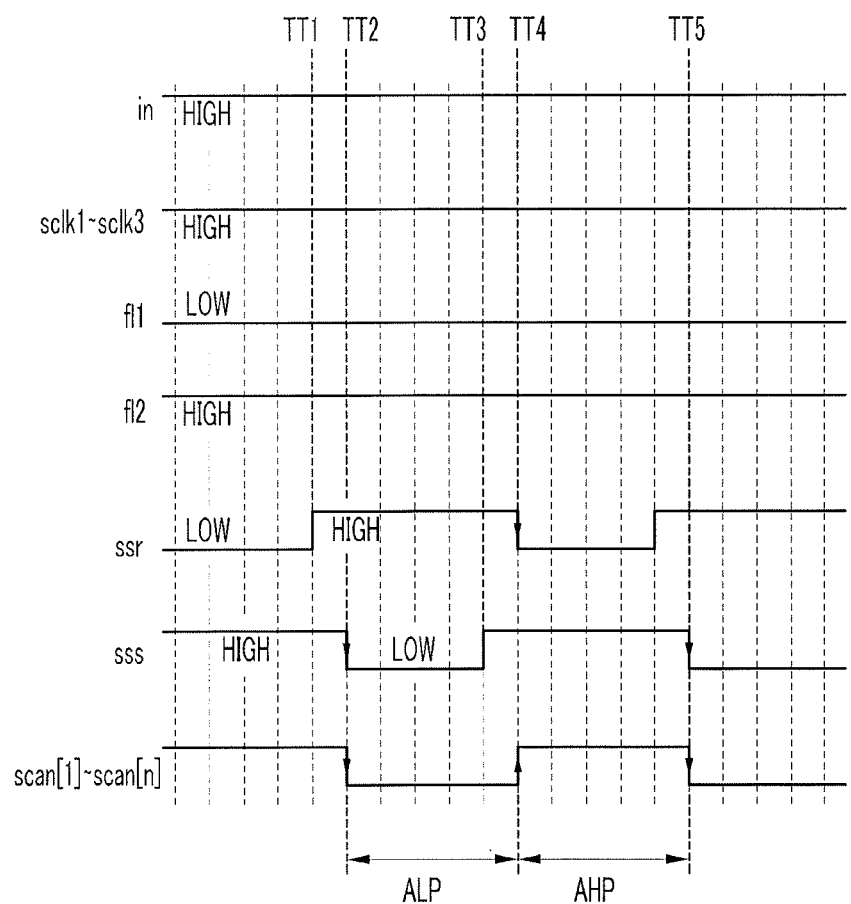
FIG. 14 is a driving timing diagram of the scan driving controlling circuit shown in FIG. 12 and realized by a simultaneous driving mode.
Figure 15:
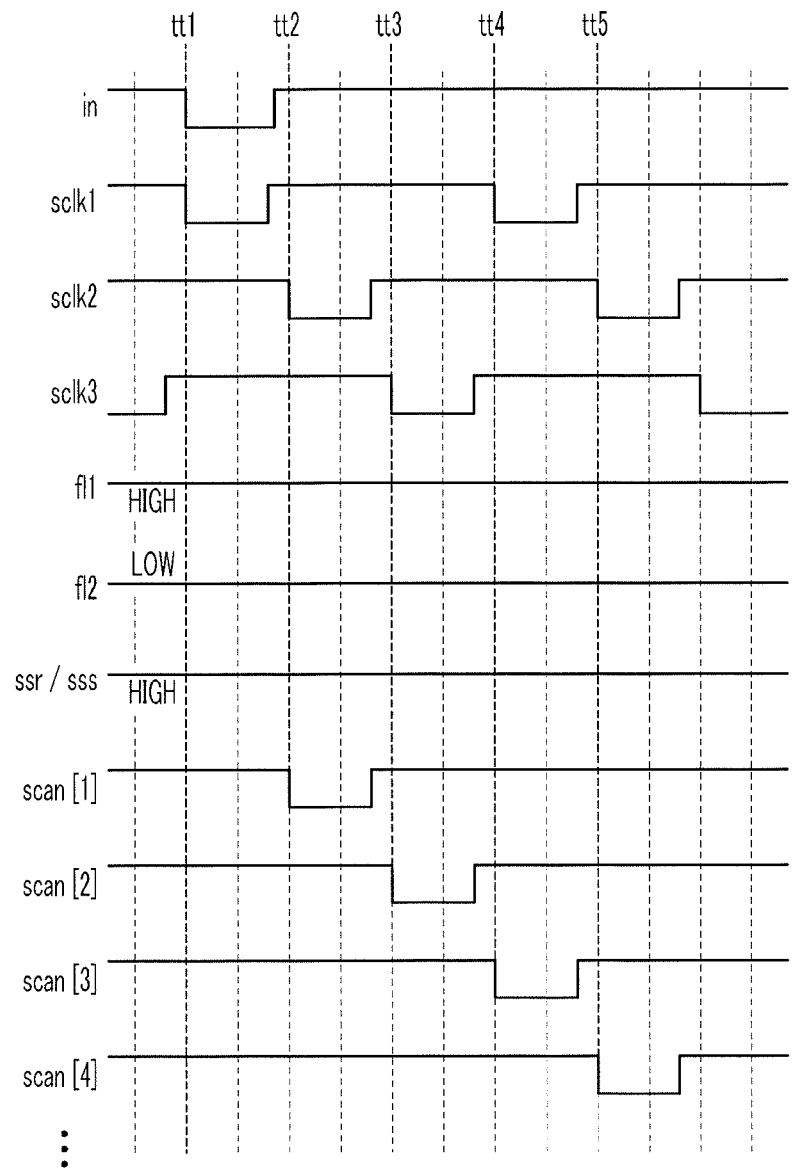
FIG. 15 is a driving timing diagram of the scan driving controlling circuit shown in FIG. 12 and realized by a sequential driving mode.

Hereafter, a scan driving method according to an exemplary embodiment is described by the circuit diagram of the scan driving control circuit 300 shown in FIG. 13 and the driving timing diagram shown in FIG. 14 and FIG. 15 and applied thereto.

FIG. 13 is a circuit diagram of a first scan driving control circuit 300 among a plurality of scan driving controlling circuits SR1 to SRn forming the scan driver 20 according to an exemplary embodiment.

Referring to FIG. 13, the first stage scan driving control circuit 300 includes a scan logic unit 301 and a scan buffer unit 302.

The operation of the scan logic unit 301 is controlled by the first driving control signal fl1, and the operation of the scan buffer unit 302 is controlled by the second driving control signal 112.

The scan logic unit 301 operated by the first driving control signal fl1 is input with the starting signal in at the input signal terminal IN and the clock signal terminals SCLK1 to SCLK3 are input with the first clock signal sclk1 to the third clock signal sclk3, and thereby the scan signal scan[1] supplied to the first scan line is output to the output signal terminal SOUT.

The scan buffer unit 302 operated by the second driving control signal fl2 receives the first control signal ssr and the second control signal sss through the control signal terminals SSR and SSS to output the scan signal scan[1] transmitted to the first scan line.

The scan driving control circuit 300 is the first stage scan driving controlling circuit among a plurality of scan driving controlling circuits such that a plurality of scan driving controlling circuits after the second stage receive the output signal output from the output terminal SOUT of the scan driving controlling circuit at the input signal terminal IN.

The first clock signal terminal SCLK1, the second clock signal terminal SCLK2, and the third clock signal terminal SCLK3 of the scan logic unit 301 are alternately and sequentially transmitted the first clock signal sclk1 to the third clock signal sclk3 according to the position of the scan driving controlling circuit.

In the circuit diagram of FIG. 13, the scan logic unit 301 includes transistors J1 to J8, a first capacitor CA1, and a second capacitor CA2. Among them, the transistors J3, J4, and J5 may respectively further include one transistor J30, J40, and 350 and they are coupled in series.

The transistor J1 includes the source electrode connected to the first scan logic power source voltage SLVH of the high potential, the drain electrode connected to the node where one terminal of the first capacitor CA1 and the output signal terminal SOUT meet to each other, and the gate electrode connected to the node NO2.

The first scan logic power source voltage SLVH of the high potential is a different power source voltage that is separated from the first scan buffer power source voltage SBVH of the high potential supplied to the buffer unit 302.

The transistor J2 includes the source electrode connected to the second clock signal sclk2, the drain electrode connected to the node where the one terminal of the first capacitor CA1 and the output signal terminal SOUT meet each other, and the gate electrode connected to the node NO1.

The transistor J3 includes the source electrode connected of the first scan logic power source voltage SLVH, the drain electrode connected to the node NO1, and the gate electrode connected to the input signal terminal FL1. According to an embodiment, at least one transistor that is coupled in series to the transistor J3 may be further included. In FIG. 13, the transistor J30 is further included, and the transistor J30 may include the gate electrode connected like the gate electrode of the transistor J3, the source electrode connected to the drain electrode of the transistor J3, and the drain electrode connected to the node NO1.

The transistor J4 includes the source electrode connected to the first scan logic power source voltage SLVH, the drain electrode connected to the node NO2, and the gate electrode connected to the input signal terminal FL1. According to an embodiment, at least one transistor that is coupled in series to the transistor J4 may be further included. In FIG. 13, the transistor J40 is further included, and the transistor J40 includes the gate electrode connected like the gate electrode of the transistor J4, the source electrode connected to the drain electrode of the transistor J4, and the drain electrode connected to the node NO2.

The transistor J5 includes the source electrode connected to the first scan logic power source voltage SLVH, the drain electrode connected to the node N01, and the gate electrode supplied with the second scan logic power source voltage SLVL of the low potential through the transistor J8.

The transistor J6 includes the gate electrode connected to the input signal terminal IN transmitted the output signal output from the output signal terminal SOUT of the scan driving controlling circuit of the previous stage or the starting signal in, the source electrode connected to the first scan logic power source voltage SLVH, and the drain electrode connected to the node NO2.

The transistor J7 includes the source electrode connected to the input signal terminal IN, the drain electrode connected to the node N01, and the gate electrode connected to the first clock signal terminal SCLK1.

The transistor J8 includes the source electrode connected to the second scan logic power source voltage SLVL of the low potential, the drain electrode connected to the node NO2, and the gate electrode connected to the third clock signal terminal SCLK3.

The voltage of the second scan logic power source voltage SLVL is a lower level than the first scan logic power source voltage SLVH. The second scan logic power source voltage SLVL of the low potential is a different power source voltage that is separated from the second scan buffer power source voltage SBVL of the low potential supplied to the scan buffer unit 302.

The first capacitor CA1 includes one terminal connected to the node where the drain electrode of the transistor J1, the source electrode of the transistor J2, and the output signal terminal SOUT meet, and the other terminal of the node NO1.

The second capacitor CA2 includes one terminal connected to the first scan logic power source voltage SLVH and the other terminal connected to the node NO2.

A capacitor including one terminal connected to the first scan logic power source voltage SLVH and the other terminal connected to the output signal terminal SOUT, may be further included.

On the other hand, the scan buffer unit 302 includes transistors K1 to K9, a third capacitor CA3, and a fourth capacitor CA4. The transistors K4 to K9 may further include one transistor K40 to K90, and they are coupled in series. The source electrode of each of the transistors K40 to K90 is connected to the drain electrode of the transistors K4 to K9, and the gate electrode is connected to receive the same signal as the gate electrode of the transistors K4 to K9 such that the description of these transistors replaces the description of the transistors K4 to K9.

In the scan buffer unit 302, each source electrode of the transistors K1, K3, K4, K5, K6, and K7 is connected to the first scan buffer power source voltage SBVH of the high potential, the drain electrode of the transistor K1 is connected to one terminal of the third capacitor CA3, each drain electrode of the transistors K3, K5, and K6 is connected to the node QF, and each drain electrode of the transistors K4 and K7 is connected to the node QE.

The gate electrode of the transistor K1 is connected to the node QF, the gate electrode of the transistor K3 is connected to the node QE, and the gate electrode of each of the transistors K4 and K5 is connected to the second driving control signal terminal FL2. The gate electrode of the transistor K6 is connected to the second control signal sss, and the gate electrode of the transistor K7 is connected to the first control signal ssr.

In the scan buffer unit 302, each source electrode of the transistors K2, K8, and K9 is connected to the second scan buffer power source voltage SBVL of a level voltage lower than the first scan buffer power source voltage SBVH of the high potential, the drain electrode of the transistor K2 is connected to one terminal of the third capacitor CA3, the drain electrode of the transistor K8 is connected to the node QF, and the drain electrode of the transistor K9 is connected to the node QE.

The gate electrode of the transistor K2 is connected to the node QE connected to the other terminal of the third capacitor CA3, the gate electrode of the transistor K8 is connected to the first control signal ssr, and the gate electrode of the transistor K9 is connected to the second control signal sss.

One terminal of the third capacitor CA3 of the scan buffer unit 302 is connected to the output signal terminal SOUT outputting the scan signal scan[1], and the other terminal is connected to the node QE. The fourth capacitor CA4 includes one terminal connected to the first scan buffer power source voltage SBVH and the other terminal connected to the node QF.

Hereafter, a driving controlling method of the scan signal generated and output to realize a simultaneous driving mode or a sequential driving mode in the scan driving controlling circuit will be described by using the circuit diagram of FIG. 13, and the timing diagram of FIG. 14 and FIG. 15.

FIG. 14 is a timing diagram of a simultaneous driving mode in which all scan signals scan[1] to scan[n] are simultaneously turned on or off.

FIG. 14 is a timing diagram of a case of simultaneously turning on/off the scan signals applied to a plurality of pixels to reset before the data writing period or to compensate a threshold voltage of the driving transistor in the display device of the simultaneous light emitting method.

In the simultaneous driving mode, the first driving control signal fl1 as the low level is input to the input signal terminal FL1 of the scan logic unit 301. The second driving control signal fl2 as the pulse of the high level is input to the input signal terminal FL2 of the scan buffer unit 302. The starting signal in and the first clock signal sclk1 to the third clock signal sclk3 are all transmitted to the scan logic unit 301 as the high level.

The transistors J3 and J4 are turned on corresponding to the first driving control signal fl1 transmitted to the scan logic unit 301 such that the high level voltage of the first scan logic power source voltage SLVH is respectively transmitted to the nodes NO1 and NO2. Accordingly, the transistors J2 and J1 are respectively turned off such that the scan logic unit 301 is not operated and the output signal transmitted to the output signal terminal SOUT depends on the operation of the scan buffer unit 302. The rest of the transistors of the scan logic unit 301 are also turned off by the voltage of the high level applied to the gate electrode. In the simultaneous driving mode, the scan buffer unit 302 becomes a configuration generating the output signal of the simultaneous driving.

In FIG. 14, during a period when the first control signal ssr is transited from the low level and the high level and is maintained at the time TT1, the second control signal sss is transmitted with the pulse of the low level from the high level at the time TT2. The transistors K7 and K8 that are transmitted to the first control signal ssr at the time TT2 are turned off, and the transistors K6 and K9 that are transmitted to the second control signal sss are turned on. Accordingly, the first scan buffer power source voltage SBVH of the high potential is transmitted to the node QF through the transistor K6 such that the transistor K1 is turned off. The second scan buffer power source voltage SBVL of the low potential is transmitted to the node QE through the transistor K9 such that the transistor K2 is turned on. Accordingly, all output signals are generated as the low voltage level of the second scan buffer power source voltage SBVL transmitted from the source electrode of the transistor K2. The voltage of the second scan buffer power source voltage SBVL transmitted to the node QE is stored to the third capacitor CA3 such that the low potential level is maintained during the period ALP when all output signals are output as the low level.

During the period ALP when all scan signals generated as the output signal by the simultaneous driving mode are the low level, the second control signal sss is shifted from the low level to the high level at the time TT3, and the first control signal ssr is transited from the high level to the low level at the time TT4.

The transistors K6 and K9 that are transmitted to the second control signal sss are respectively turned off at the time TT3, and the transistors K7 and K8 that are transmitted to the first control signal ssr are turned on at the time TT4. Accordingly, the first scan buffer power source voltage SBVH of the high potential is transmitted to the node QE through the transistor K7 to turn off the transistor K2. The second scan buffer power source voltage SBVL of the low potential is transmitted to the node QF through the transistor K8 such that the transistor K1 is turned on. Thus, all output signals of the first scan buffer power source voltage SBVH from the source electrode of the transistor K1 are generated as the high voltage level. Here, the voltage of the first scan buffer power source voltage SBVH transmitted to the node QE is stored to the third capacitor CA3 such that the high potential level is maintained during the period AHP when all output signals are output as the high level.

A large current may flow in a moment, at the operation time, when all pixels of the display unit are simultaneously turned on/off. The high level and the low level voltage are output in the scan buffer unit 302 at the operation times such as TT2, TT4, and TT5 such that a large amount of current flows, and then the IR drop is generated for the buffer power source voltage. However, according to an exemplary embodiment, the power source voltages supplied to the scan buffer unit 302 and the scan logic unit 301 are separated such that the power source voltage of the scan logic unit 301 is not affected, although the IR drop is generated for the buffer power source voltage of the scan buffer unit 302.

FIG. 15 is a timing diagram of a sequential driving mode in which the scan signals scan[1] to scan[n] are sequentially generated as the pulse of the on voltage level.

FIG. 14 is the driving timing diagram in which the scan signals applied to the plurality of pixel rows are generated to sequentially select a plurality of pixels of the entire display unit 10 for the pixel row at a data writing period in the display device of a simultaneous light emitting method SEAV.

In the sequential driving mode, the first driving control signal fl1 as the high level is input to the input signal terminal FL1 of the scan logic unit 301. The second driving control signal fl2 as the pulse of the low level is input to the input signal terminal FL2 of the scan buffer unit 302. The transistors J3 and J4 are turned off corresponding to the first driving control signal fl1 transmitted to the scan logic unit 301, and the transistors K4 and K5 are turned on corresponding to the second driving control signal fl2 transmitted to the scan buffer unit 302. The high level voltage of the first scan buffer power source voltage SBVH is respectively transmitted to the nodes QE and QF. Accordingly, the transistors K2 and K1 are turned off such that the scan buffer unit 302 is not operated, and the output signal transmitted to the output signal terminal SOUT depends on the operation of the scan logic unit 301. The rest of the transistors of the scan buffer unit 302 are turned off by the voltage of the high level of the first control signal ssr and the second control signal sss. Accordingly, in the sequential driving mode, the scan logic unit 301 becomes a configuration generating the output signal of the sequential driving.

If the phase of the starting signal is changed from the high level to the low level at the time tt1, the transistor J6 is turned on and the first scan logic power source voltage SLVH of the high potential is transmitted to the node NO2. The node NO2 is applied as the high potential voltage such that the transistor J1 is turned off.

The first clock signal sclk1 as the low state is transmitted to the transistor J7 at the time tt1, and the transistor J7 is turned on such that the voltage of the low level state of the starting signal in transmitted to the input signal terminal IN is transmitted to the node NO1. Accordingly, the capacitor CA1 is charged and the transistor J2 is turned on. Thus, the scan signal scan[1] is generated through the output signal terminal SOUT corresponding to the voltage level of the pulse of the second clock signal sclk2 transmitted through the transistor J2. The output signal of the low level, the scan signal scan[1], is generated according to the voltage level of the pulse of the second clock signal sclk2 at the time tt2.

The scan signal scan[1] generated in the first scan driving control circuit 300 is transmitted to the scan logic unit of the scan driving controlling circuit of the next stage. The scan signal scan[1] generated at the time tt2 is transmitted to the input signal terminal IN of the scan logic unit of the scan driving controlling circuit of the next stage.

In the scan driving controlling circuit of the second stage, the first clock signal terminal SCLK1 is transmitted the second clock signal sclk2 such that the transistors J6 and J7 are turned on and the scan signal scan[2] of the second circuit stage is generated according to the voltage level of the clock signal input to the second clock signal terminal SCLK2 connected to the source electrode of the transistor J2 by the above-described driving mode.

In the scan driving controlling circuit of the second stage, the clock signal input to the second clock signal terminal SCLK2 is the third clock signal sclk3 such that the scan signal scan[2] of the low level is generated corresponding to the low level pulse of the third clock signal sclk3 at the time tt3.

By the method described in the embodiments, the scan signals are sequentially generated as the output signal in the scan logic unit of the scan driving controlling circuit of a plurality of stages, and the scan signals are shifted corresponding to the shift period between the plurality of clock signals are sequentially generated.

By way of summation and review, in the display panel of a large-sized display device of the related art, a circuit design may be required that provides a high quality screen display in the sequential light emitting mode, as well as the simultaneous light emitting mode, by preventing the abnormal circuit operation of the driver due to an IR drop for a simultaneously on/off operation period.

Embodiments may be directed to a light emission control driver and a display device using the same, capable of selectively realizing various light emitting modes corresponding to a screen driving method of a display device, or a scan driver sequentially generating a signal having a pulse waveform of the on voltage level, or a waveform of a simultaneous on/off period corresponding to a driving method of a 3D stereoscopic image screen.

A display device of the embodiments may also compensate an IR drop in the circuit operation of the driver, preventing crosstalk, and providing high quality.

According to the embodiments, a circuit design of a driver may be capable of being applied to a single MOS process of a PMOS transistor or an NMOS transistor, separately attached as an I/C outside or integrated inside a glass of a display device, thereby reducing size, weight, and cost.

Exemplary embodiments have been disclosed herein, and although specific terms are employed, they are to be interpreted in a generic and descriptive sense only and not for purpose of limitation.

What is claimed is:

1. A driver, comprising:
   at least one logic circuit to receive a plurality of clock signals and a plurality of input signals to generate and sequentially transmit first and second output signals to a plurality of pixel rows included in a display; and
   a buffer, receiving the first output signal, the second output signal, a first control signal, and a second control signal, to generate and transmit a light emission control signal of a same waveform to a plurality of pixels included in the display, wherein the at least one logic circuit includes a first logic circuit receiving the plurality of clock signals and a first input signal to generate the first output signal, and a second logic circuit receiving the plurality of clock signals and a second input signal to generate the second output signal,
   wherein the at least one logic circuit is supplied with a logic power source voltage, and the buffer is supplied with a buffer power source voltage,
   wherein the buffer power source voltage is different from the logic power source voltage, and
   wherein in a case of a simultaneous driving mode in which the light emission control signal is simultaneously output with a same waveform, the first input signal and the second input signal are transmitted with a gate-off voltage level to the first logic circuit and the second logic circuit, such that the first logic circuit and the second logic circuit, respectively, are not operated.

2. The driver as claimed in claim 1, wherein: the logic power source voltage includes a first logic power source voltage of a predetermined voltage level and a second logic power source voltage of a lower voltage level than the first logic power source voltage.

3. The driver as claimed in claim 1, wherein: the buffer power source voltage includes a first buffer power source voltage of a predetermined voltage level and a second buffer power source voltage of a lower voltage level than the first buffer power source voltage.

4. The driver as claimed in claim 1, wherein:
   in a case of a simultaneous driving mode in which the light emission control signal is simultaneously output with a same waveform, a pulse width of the light emission control signal is determined by a period difference between a time that the first control signal is transmitted with a pulse of a gate-on voltage and the time that the second control signal is transmitted with the pulse of the gate-on voltage level.

5. The driver as claimed in claim 1, wherein:

in a case of a sequential driving mode in which the light emission control signal is sequentially output to a plurality of pixel rows of the display, the pulse width of the light emission control signal is determined by a period difference between a time that the first input signal is transmitted to the first logic circuit with a gate-on voltage level and a time that the second input signal is transmitted to the second logic circuit with the gate-on voltage level.

6. The driver as claimed in claim 5, wherein:

a time that a phase of the light emission control signal is changed into a gate-off voltage level is synchronized with a transmission time of a first low level pulse, the first low level pulse being from the plurality of clock signals transmitted to the first logic circuit when the first input signal is transmitted with the gate-on voltage level, and a time that the phase of the light emission control signal is changed into the gate-on voltage level is synchronized with a transmission time of a second low level pulse, the second low level pulse being from the plurality of clock signals transmitted to the second logic circuit when the second input signal is transmitted with the gate-on voltage level.

7. The driver as claimed in claim 1, wherein:

the first logic circuit includes:

a first switch, switchably operated by a first clock signal among the plurality of clock signals and transmitting a first voltage according to the first input signal to a first node, a second switch switchably operated by the first input signal and transmitting the first logic power source voltage to a second node, a third switch switchably operated corresponding to the first voltage transmitted to the first node and transmitting a second voltage according to a second clock signal among the plurality of clock signals as a first output voltage of the first output signal, a fourth switch switchably operated corresponding to the first logic power source voltage transmitted to the second node and transmitting the first logic power source voltage as a first output voltage of the first output signal, a first capacitor storing the voltage transmitted to the first node, and a second capacitor storing the voltage transmitted to the second node.

8. The driver as claimed in claim 7, wherein the first logic circuit includes:

a fifth switch switchably operated by a third clock signal among the plurality of clock signals and transmitting a second logic power source voltage having a lower level than the first logic power source voltage, to the second node, and at least one sixth switch switchably operated by the second logic power source voltage transmitted to the second node and transmitting the first logic power source voltage to the first node.

9. The driver as claimed in claim 1, wherein:

the second logic circuit includes:

a seventh switch switchably operated by a third clock signal among the plurality of clock signals and transmitting a third voltage according to the second input signal to a third node, an eighth switch switchably operated by the second input signal and transmitting the first logic power source voltage to a fourth node, a ninth switch switchably operated corresponding to the third voltage transmitted to the third node and transmitting a fourth voltage according to a first clock signal among the plurality of clock signals as a second output voltage level of the second output signal, a tenth switch switchably operated corresponding to the first logic power source voltage transmitted to the fourth node and transmitting the first logic power source voltage as the second output voltage level of the second output signal, a third capacitor storing the voltage transmitted to the third node; and a fourth capacitor storing the voltage transmitted to the fourth node.

10. The driver as claimed in claim 9, wherein:

the second logic circuit includes:

an eleventh switch switchably operated by a second clock signal, among the plurality of clock signals, and transmitting the second logic power source voltage, the second logic power source voltage having a lower level than the first logic power source voltage, to the fourth node; and at least one twelfth switch switchably operated by the second logic power source voltage transmitted to the fourth node and transmitting the first logic power source voltage to the third node.

11. The driver as claimed in claim 1, wherein:

the buffer includes:

at least one thirteenth switch switchably operated by the first output signal and transmitting a first buffer power source voltage to a fifth node, at least one fourteenth switch switchably operated by the first output signal and transmitting a second buffer power source voltage, the second buffer power source voltage having a lower level than the first buffer power source voltage to a sixth node, at least one fifteenth switch switchably operated by the second output signal and transmitting the second buffer power source voltage to the fifth node, at least one sixteenth switch switchably operated by a first control signal and transmitting the first buffer power source voltage to the fifth node, at least one seventeenth switch switchably operated by the first control signal and transmitting the second buffer power source voltage to the sixth node, at least one eighteenth switch switchably operated by a second control signal and transmitting the first buffer power source voltage to the sixth node, at least one nineteenth switch switchably operated by the second control signal and transmitting the second buffer power source voltage to the fifth node, a twentieth switch switchably operated by a fifth voltage of the fifth node and transmitting the first buffer power source voltage to the sixth node, a twenty-first switch switchably operated by a sixth voltage transmitted to the sixth node and transmitting the first buffer power source voltage as a voltage level of the light emission control signal, a twenty-second switch switchably operated by the fifth voltage transmitted to the fifth node and transmitting the second buffer power source voltage as the voltage level of the light emission control signal, a fifth capacitor storing the voltage transmitted to the fifth node, and a sixth capacitor storing the voltage transmitted to the sixth node.

12. The driver as claimed in claim 1, wherein: circuit elements of the first logic circuit and the second logic circuit and the buffer include a plurality of transistors which are only PMOS transistors or only NMOS transistors.

13. The driver as claimed in claim 1, wherein:
the at least one logic circuit receives the plurality of clock signals, a first input signal, and a first driving control signal to generate scan signals to sequentially transmit the scan signals to a plurality of pixel rows of the display, and
the buffer is a scan driver receiving a second driving control signal, a first control signal, and a second control signal to generate scan signals simultaneously transmitted with a same scan signal waveform to the plurality of pixels included in the display.

14. The driver as claimed in claim 13, wherein:
the first driving control signal and the second driving control signal have opposite phases,
the buffer is operated corresponding to a gate-on voltage level of the first driving control signal, and
the at least one logic circuit is operated corresponding to a gate-on voltage level of the second driving control signal.

15. The driver as claimed in claim 13, wherein:
in a case that the buffer is operated, a pulse width of a scan signal output from the buffer is determined by a period difference between a time that the first control signal is transmitted with a pulse of a gate-on voltage level and a time that the second control signal is transmitted with the pulse of the gate-on voltage level.

16. The driver as claimed in claim 13, wherein: in a case that the logic circuit is operated, the scan signals sequentially output from the logic are shifted corresponding to a period that is shifted between the plurality of clock signals.

17. The driver as claimed in claim 13, wherein:
the at least one logic circuit includes:
a first transistor switchably operated by a first clock signal among the plurality of clock signals and transmitting a voltage of a voltage level according to the first input signal to a first node,
a second transistor switchably operated by the first input signal and transmitting a first scan logic power source voltage to a second node,
a third transistor switchably operated corresponding to the voltage transmitted to the first node and transmitting a voltage according to a voltage level of a second clock signal among the plurality of clock signals as the voltage level of the scan signal,
a fourth transistor switchably operated corresponding to the voltage transmitted to the second node and transmitting the first scan logic power source voltage as the voltage level of the scan signal,
a fifth transistor switchably operated by the first driving control signal and transmitting the first scan logic power source voltage to the first node,
a sixth transistor switchably operated by the first driving control signal and transmitting the first scan logic power source voltage to the second node,
a first capacitor storing the voltage transmitted to the first node, and
a second capacitor storing the voltage transmitted to the second node.

18. The driver as claimed in claim 17, wherein:
the at least one logic circuit includes:
a seventh transistor switchably operated by a third clock signal of the plurality of clock signals and transmitting a second scan logic power source voltage of a lower level than the first scan logic power source voltage to the second node, and
at least one eighth transistor switchably operated by the second scan logic power source voltage transmitted to the second node and transmitting the first scan logic power source voltage to the first node.

19. The driver as claimed in claim 13, wherein:
the buffer includes:
at least one ninth transistor switchably operated by the first control signal and transmitting a first scan buffer power source voltage to a third node,
at least one tenth transistor switchably operated by the first control signal and transmitting a second scan buffer power source voltage of a lower voltage level than the first scan buffer power source voltage, to a fourth node,
at least one eleventh transistor switchably operated by the second control signal and transmitting the first scan buffer power source voltage to the fourth node,
at least one twelfth transistor switchably operated by the second control signal and transmitting the second scan buffer power source voltage to the third node,
at least one thirteenth transistor switchably operated by the second driving control signal and transmitting the first scan buffer power source voltage to the third node,
at least one fourteenth transistor switchably operated by the second driving control signal and transmitting the first scan buffer power source voltage to the fourth node;
a fifteenth transistor switchably operated by the voltage transmitted to the third node and transmitting the first scan buffer power source voltage to the fourth node;
a sixteenth transistor switchably operated by the second scan buffer power source voltage transmitted to the fourth node and transmitting the first scan buffer power source voltage as a voltage level of the scan signal;
a seventeenth transistor switchably operated by the second scan buffer power source voltage transmitted to the third node and transmitting the second scan buffer power source voltage as the voltage level of the scan signal;
a third capacitor storing the voltage transmitted to the third node; and
a fourth capacitor storing the voltage transmitted to the fourth node.

20. The driver as claimed in claim 13, wherein circuits element of the at least one logic circuit and the buffer include a plurality of transistors, the plurality of transistors are realized by only PMOS transistors or only NMOS transistors.

21. The driver as claimed in claim 1, wherein:
first edges of the control signals are offset by a first time,
second edges of the control signals are offset by a second time, and
the width of each of the output signals is based on a later one of the first edges of the control signals and a later one of the second edges of the control signals.

22. The driver as claimed in claim 21, wherein the width of each of the output signals is based on the first edge of a first one of the control signals and the second edge of a second one of the control signals.

23. The driver as claimed in claim 21, wherein the control signals have different widths.

24. The driver as claimed in claim 23, wherein:
a first one of the control signals has a first width,
a second one of the control signals has a second width,
the first width is less than a width of each of the output signals, and
the second width is greater than a width of each of the output signals.

25. The driver as claimed in claim 21, wherein the first time is substantially equal to the second time.

26. A display device, comprising:
a display including a plurality of pixels connected to a plurality of scan lines transmitting a plurality of scan signals, a plurality of data lines transmitting a plurality of data signals, and a plurality of light emission control lines transmitting a plurality of light emission control signals;
a scan driver transmitting the plurality of scan signals to the plurality of scan lines;
a data driver transmitting the plurality of data signals to the plurality of data lines; and
a light emission control driver transmitting the plurality of light emission control signals to the plurality of light emission control lines, wherein:
the scan driver or the light emission control driver includes:
at least one logic circuit to receive a plurality of clock signals and a plurality of input signals to generate and sequentially transmit output signals to a plurality of pixel rows included in the display, and
a buffer to receive a plurality of control signals to generate and transmit the output signals of a same waveform to the plurality of pixels included in the display, and
the at least one logic circuit is supplied with a logic power source voltage and the buffer is supplied with a buffer power source voltage that is different from the logic power source voltage, wherein the control signals to be received by the buffer are independent from the clock signals to be received by the at least one logic circuit and are to control a width of each of the output signals transmitted from the buffer.

27. The display device as claimed in claim 26, wherein:
in the case of a sequential driving mode, the scan driver or the light emission control driver generates the output signals by operating the at least one logic circuit, and
in the case of a simultaneous driving mode, the scan driver or the light emission control driver generates the output signals by operating the buffer.

28. The display device as claimed in claim 26, wherein:
the logic power source voltage includes a first logic power source voltage having a predetermined voltage level and a second logic power source voltage of a lower voltage level than the first logic power source voltage.

29. The display device as claimed in claim 26, wherein:
the buffer power source voltage includes a first buffer power source voltage having a predetermined voltage level and a second buffer power source voltage of a lower voltage level than the first buffer power source voltage.

* * * * *